(12) United States Patent
Hwang

(10) Patent No.: US 12,254,945 B2
(45) Date of Patent: Mar. 18, 2025

(54) NEUROMORPHIC DEVICE

(71) Applicant: Samsung Electronics Co., Ltd., Suwon-si (KR)

(72) Inventor: Youngnam Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 119 days.

(21) Appl. No.: 18/204,020

(22) Filed: May 31, 2023

(65) Prior Publication Data

US 2023/0386601 A1  Nov. 30, 2023

(30) Foreign Application Priority Data

May 31, 2022  (KR) ........................ 10-2022-0067231

(51) Int. Cl.
*G11C 11/54* (2006.01)
*G11C 29/00* (2006.01)
*G11C 29/52* (2006.01)

(52) U.S. Cl.
CPC ............ *G11C 29/808* (2013.01); *G11C 29/52* (2013.01); *G11C 29/802* (2013.01)

(58) Field of Classification Search
CPC ..... G11C 29/808; G11C 29/52; G11C 29/802; G11C 7/14; G11C 2013/0054; G11C 2213/79; G11C 2213/82; G11C 7/1006; G11C 11/54; G11C 13/0026; G11C 13/0028; G11C 13/003; G11C 13/004; G11C 29/76; G11C 2029/1202; G11C 2029/1204; G11C 29/702; G11C 29/025; G11C 29/4401; G11C 29/83; G06N 3/065; G06N 3/063; H03M 1/12

See application file for complete search history.

(56) References Cited

U.S. PATENT DOCUMENTS

| | | | |
|---|---|---|---|
| 10,446,246 B2 | 10/2019 | Tran et al. | |
| 10,607,710 B2 | 3/2020 | Tran et al. | |
| 10,762,420 B2 | 9/2020 | Teig et al. | |
| 10,831,860 B2 | 11/2020 | Kim et al. | |
| 11,087,207 B2 | 8/2021 | Tran et al. | |
| 2005/0213401 A1* | 9/2005 | Shimizu | G11C 29/816 |
| | | | 365/158 |
| 2007/0140023 A1* | 6/2007 | Helfer | G11C 29/789 |
| | | | 365/200 |
| 2009/0103350 A1* | 4/2009 | Kund | G11C 29/70 |
| | | | 365/201 |

(Continued)

*Primary Examiner* — Jay W. Radke
(74) *Attorney, Agent, or Firm* — Sughrue Mion, PLLC

(57) ABSTRACT

A neuromorphic device includes a memory cell array including first resistive memory cells connected to word lines, bit lines and source lines, second resistive memory cells connected to the word lines, at least one redundancy bit line and at least one redundancy source line, third resistive memory cells connected to at least one redundancy word line, the bit lines and the source lines. The memory cell array stores data corresponding to a weight of a neural network in the first resistive memory cells, and is configured to generate a plurality of read currents based on input signals and the data. The neuromorphic device further includes an analog to digital converter (ADC) circuit configured to convert the plurality of read currents into a plurality of digital signals.

20 Claims, 32 Drawing Sheets

(56) References Cited

U.S. PATENT DOCUMENTS

| | | | |
|---|---|---|---|
| 2010/0157656 A1* | 6/2010 | Tsuchida | G11C 29/4401 365/230.06 |
| 2013/0051133 A1* | 2/2013 | Son | G11C 11/161 365/158 |
| 2018/0025790 A1* | 1/2018 | Merced Grafals | G11C 13/0021 365/148 |
| 2019/0303741 A1 | 10/2019 | Appuswamy et al. | |
| 2020/0019849 A1 | 1/2020 | Tran et al. | |
| 2020/0327400 A1 | 10/2020 | Shibata et al. | |
| 2021/0166110 A1 | 6/2021 | Song | |
| 2021/0342677 A1 | 11/2021 | Dalli et al. | |
| 2021/0365778 A1 | 11/2021 | Dey et al. | |
| 2022/0366976 A1 | 11/2022 | Hwang | |

\* cited by examiner

FIG. 9A

|  | Cell Fault(Stuck/Flip) | Column Fault | Row Fault |
|---|---|---|---|
| Weight Array | Corresponding Column Corresponding ADC | Corresponding Column All ADC | All Column All ADC |
| Reference Array | All Column Corresponding ADC | | |

FIG. 9B

| ADC 출력 | Column 1 | Column 2 | Column 3 | ... | Column N |
|---|---|---|---|---|---|
| P=0 | 0 | 0 | 0 | 0 | 0 |
| P=1 | 1 | 1 | 1 | 1 | 1 |
| P=2 | 2 | 2 | 2 | 2 | 2 |
| ... | ... | ... | ... | ... | ... |
| P=M-1 | M-1 | M-1 | M-1 | M-1 | M-1 |

FIG. 9C

| ADC 출력 | Column 1 | Column 2 | Column 3 | ... | Column N |
|---|---|---|---|---|---|
| P=0 | 1 | 0 | 0 | 0 | 0 |
| P=1 | 1 | 1 | 1 | 1 | 1 |
| P=2 | 2 | 2 | 2 | 2 | 2 |
| ... | ... | ... | ... | ... | ... |
| P=M-1 | M-1 | M-1 | M-1 | M-1 | M-1 |

| ADC 출력 | Column 1 | Column 2 | Column 3 | ... | Column N |
|---|---|---|---|---|---|
| P=0 | 0 | 0 | 0 | 0 | 0 |
| P=1 | 1 | 0 | 1 | 1 | 1 |
| P=2 | 2 | 0 | 2 | 2 | 2 |
| ... | ... | ... | ... | ... | ... |
| P=M-1 | M-1 | 0 | M-1 | M-1 | M-1 |

| ADC 출력 | Column 1 | Column 2 | Column 3 | ... | Column N |
|---|---|---|---|---|---|
| P=0 | 0 | 0 | 0 | 0 | 0 |
| P=1 | 2 | 2 | 2 | 2 | 2 |
| P=2 | 2 | 2 | 2 | 2 | 2 |
| ... | ... | ... | ... | ... | ... |
| P=M−1 | M−1 | M−1 | M−1 | M−1 | M−1 |

FIG. 16

| Weight \ Ref | No failure | Low current | High current |
|---|---|---|---|
| No failure | As is | Weight WL off write HRS | Weight WL on write LRS |
| Low curent | Reference WL off write HRS | As is | Not repairable |
| High current | Reference WL on write LRS | Not repairable | As is |

ND DEVICE

CROSS-REFERENCE TO RELATED APPLICATION

This application is based on and claims priority under 35 U.S.C. § 119 to Korean Patent Application No. 10-2022-0067231, filed on May 31, 2022, in the Korean Intellectual Property Office, the disclosure of which is incorporated by reference herein in its entirety.

BACKGROUND

The present disclosure relates to a neuromorphic device, and more particularly, to a fault detection and repair method of a neuromorphic device.

The neuromorphic device is a semiconductor device manufactured by simulating an information processing method of the brain by manufacturing an artificial nervous system at a neuron level, and may implement deep learning neural networks, neuromorphic computing, etc.

The neuromorphic device may execute a multiply and accumulate (MAC) operation that multiplies input data by a weight and sums multiplication results, and may include a plurality of memory cells that store the weight in data form to execute the MAC operation. Various methods of improving the performance of the neuromorphic device and reducing power consumption thereof have been proposed.

SUMMARY

One or more embodiments provide a neuromorphic device that detects a fault of a memory array included in the neuromorphic device and repairs the detected fault.

According to an aspect of an example embodiment, a neuromorphic device includes: a first memory cell array including: first resistive memory cells connected to word lines, bit lines, and source lines, second resistive memory cells connected to the word lines, at least one redundancy bit line, and at least one redundancy source line, and third resistive memory cells connected to at least one redundancy word line, the bit lines, and the source lines, wherein the first memory cell array is configured to store weight data corresponding to a weight of a neural network in the first resistive memory cells, and generate a plurality of read currents based on input signals and the weight data; a second memory cell array including: first reference resistive memory cells connected to reference word lines, reference bit lines, and reference source lines, second reference resistive memory cells connected to the reference word lines, at least one redundancy reference bit line, and at least one redundancy reference source line, third reference resistive memory cells connected to at least one redundancy reference word line, the reference bit lines, and the reference source lines, wherein the second memory cell array is configured to generate a plurality of reference currents; and an analog to digital converter (ADC) circuit configured to convert the plurality of read currents into a plurality of digital signals based on the plurality of reference currents.

According to an aspect of an example embodiment, a neuromorphic device includes: an input buffer configured to store input values of a neural network model; a plurality of sub-arrays configured to perform a multiply and accumulate (MAC) operation based on weights of the neural network model; a plurality of redundancy sub-arrays; a layer buffer storing information about at least one sub-array of the plurality of sub-arrays in which a fault has occurred; and a control unit configured to control the at least one sub-array in which the fault has occurred to be replaced with a first redundancy sub-array of the plurality of redundancy sub-arrays, wherein each of the plurality of sub-arrays includes: a first memory cell array including: first resistive memory cells connected to word lines, bit lines, and source lines, second resistive memory cells connected to the word lines, at least one redundancy bit line, and at least one redundancy source line, and third resistive memory cells connected to at least one redundancy word line, the bit lines, and the source lines, wherein the first memory cell array is configured to store weight data corresponding to a weight of a neural network in the first resistive memory cells, and generate a plurality of read currents based on input signals and the weight data; a second memory cell array including: first reference resistive memory cells connected to reference word lines, reference bit lines, and reference source lines, second reference resistive memory cells connected to the reference word lines, at least one redundancy reference bit line, and at least one redundancy reference source line, and third reference resistive memory cells connected to at least one redundancy reference word line, the reference bit lines, and the reference source lines, wherein the second memory cell array is configured to generate a plurality of reference currents; and an analog to digital converter (ADC) circuit configured to convert the plurality of read currents into a plurality of digital signals based on the plurality of reference currents.

According to an aspect of an example embodiment, a neuromorphic device includes: a memory cell array including: first resistive memory cells connected to word lines, bit lines, and source lines, second resistive memory cells connected to the word lines, at least one redundancy bit line, and at least one redundancy source line, and third resistive memory cells connected to at least one redundancy word line, the bit lines and the source lines, wherein the memory cell array is configured to store weight data corresponding to a weight of a neural network in the first resistive memory cells, and generate a plurality of read currents based on input signals and the weight data; and an analog to digital converter (ADC) circuit configured to convert the plurality of read currents into a plurality of digital signals.

BRIEF DESCRIPTION OF THE DRAWINGS

The above and/or other aspects will be more clearly understood from the following detailed description of example embodiments taken in conjunction with the accompanying drawings in which:

FIG. 9A is a table illustrating criteria by which a neuromorphic computing device detects a fault according to an embodiment;

FIGS. 9B to 9E illustrate analog-to-digital converter (ADC) values of columns according to a change in P value according to an embodiment;

FIG. 16 is a table illustrating a row fault repair operation of a neuromorphic computing device according to an embodiment;

DETAILED DESCRIPTION

Figure 1A:
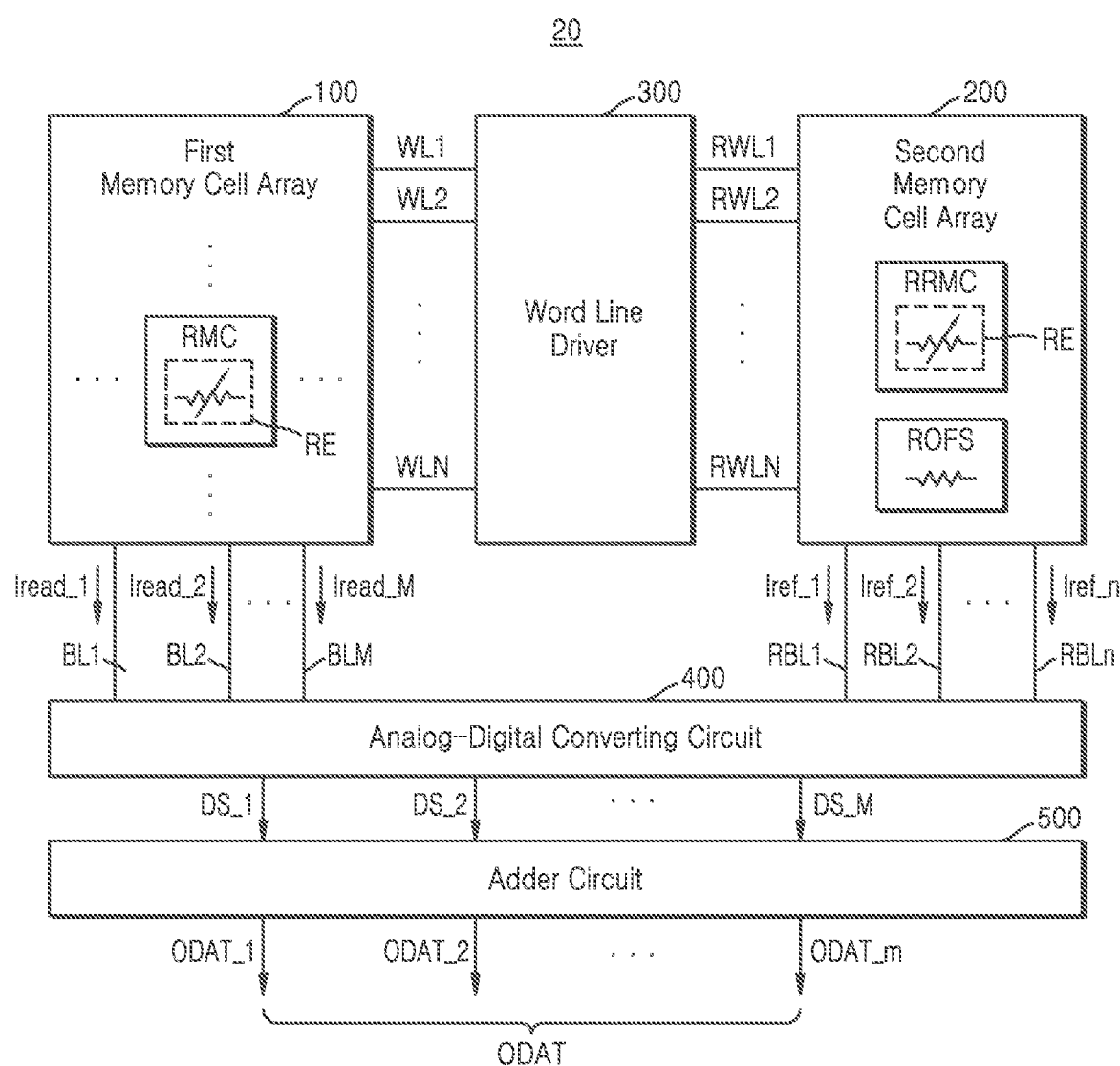
FIG. 1A is a block diagram illustrating a neuromorphic computing device according to some embodiments.

Hereinafter, example embodiments of the present disclosure will be described in more detail with reference to the accompanying drawings. The same reference numerals are used for the same components in the drawings, and redundant descriptions of the same components are omitted.

FIG. 1A is a block diagram illustrating a neuromorphic computing device 20 according to some embodiments.

Referring to FIG. 1A, the neuromorphic computing device 20 may include a sub-array 10. The sub-array may include a first memory cell array 100, a second memory cell array 200, and an analog-to-digital converting circuit 400. The neuromorphic computing device 20 may further include a word line driver 300 and an adder circuit 500. The neuromorphic computing device 20 may be referred to as a multiplier-and-accumulator (MAC), and each of the first and second memory cell arrays 100 and 200 may be referred to as a crossbar array.

The first memory cell array 100 includes a plurality of resistive memory cells RMC. Each of the plurality of resistive memory cells RMC may include a resistive element RE and may be arranged in a matrix form. For example, the plurality of resistive memory cells RMC may be disposed in regions where a plurality of word lines WL1, WL2, . . . , WLN (N is a natural number equal to or greater than 2) intersect with a plurality of bit lines BL1, BL2, . . . , BLM) (M is a natural number greater than or equal to 2), and may each be connected to one of the plurality of word lines WL1, WL2, . . . , WLN and one of the plurality of bit lines BL1, BL2, . . . , BLM. For example, the first memory cell array 100 may be referred to as a main memory cell array. A detailed structure of the first memory cell array 100 is described below with reference to FIGS. 3A to 3C.

The first memory cell array 100 stores a plurality of pieces of data. For example, the plurality of pieces of data may be stored in the plurality of resistive memory cells RMC, using a change in resistance of the resistive element RE included in each of the plurality of resistive memory cells RMC.

The first memory cell array 100 generates a plurality of input signals respectively provided through the plurality of word lines WL1, WL2, . . . , WLN by control of the word line driver 300 and a plurality of read currents Iread_1, Iread_2, . . . , Iread_M respectively based on the plurality of pieces of data stored therein, and outputs the plurality of read currents Iread_1, Iread_2, . . . , Iread_M through electrical paths including the plurality of bit lines BL1, BL2, . . . , BLM. For example, the plurality of input signals may include a plurality of input voltages and/or a plurality of input currents respectively provided through the plurality of word lines WL1, WL2, . . . , WLN. For example, the plurality of read currents Iread_1, Iread_2, . . . , Iread_M may be respectively output through the plurality of bit lines BL1, BL2, . . . , BLM or a plurality of source lines (e.g., SL1, SL2, . . . , SLM of FIG. 3C), and may be provided to the analog-to-digital converting circuit 400.

The first memory cell array 100 may further include cells constituting at least one redundancy column and/or at least one redundancy row. The cells constituting the at least one redundancy column may output a plurality of input signals respectively provided through a plurality of word lines WL1, WL2, . . . , WLN, WLR including a redundancy word line WLR and a redundancy read current Iread_R through a redundancy bit line BLR based on the plurality of pieces of data stored therein. The at least one redundancy column may operate by replacing a column in which a fault is detected among columns of the first memory cell array 100. The at least one redundancy row may operate by replacing a row in which a fault is detected among rows of the first memory cell array 100. The at least one redundancy column and the at least one redundancy row are described below.

In an embodiment, as is described below with reference to FIGS. 2A and 2B, the neuromorphic computing device 20 may be used to drive any neural network system such as an artificial neural network (ANN) system, a convolutional neural network (CNN) system, a deep neural network (DNN) system, a deep learning system, etc. and/or a machine learning system. For example, various services such as image classify service, user authentication service based on biometric information, advanced driver assistance system (ADAS) service, voice assistant service, automatic speech recognition (ASR) service, etc., and/or applications may be executed and processed by the neuromorphic computing device 20. In this case, the plurality of pieces of data stored in the first memory cell array 100 may represent a plurality of weights (e.g., a plurality of elements of a weight matrix) respectively included in a plurality of layers constituting the neural network system, and the plurality of read currents Iread_1, Iread_2, . . . , Iread_M may represent results of multiplication and accumulation operations performed by the neural network system. In other words, the first memory cell array 100 may perform data storage and calculation operations simultaneously, which is described below with reference to FIG. 3B.

The second memory cell array 200 includes a plurality of reference resistive memory cells RRMC. Similar to the plurality of resistive memory cells RMC, each of the plurality of reference resistive memory cells RRMC may include the resistive element RE and may be arranged in a matrix form. For example, the plurality of reference resistive memory cells RRMC may be disposed in regions where a plurality of reference word lines RWL1, RWL2, . . . , RWLN intersect with a plurality of reference bit lines RBL1, RBL2, . . . , RBLn (n is a natural number equal to or greater than 2), and may each be connected to one of the plurality of reference word lines RWL1, RWL2, . . . , RWLN and one of the plurality of reference bit lines RBL1, RBL2, . . . , RBLn. For example, the second memory cell array 200 may be referred to as a reference memory cell array. A detailed structure of the second memory cell array 200 is described below with reference to FIG. 4.

The second memory cell array 200 generates a plurality of reference currents Iref_1, Iref_2, . . . , Iref_n by control of the word line driver 300, and outputs the plurality of reference currents Iref_1, Iref_2, . . . , Iref_n through electrical paths including the plurality of reference bit lines RBL1, RBL2, . . . , RBLn. For example, the plurality of reference currents Iref_1, Iref_2, . . . Iref_n may be respectively output through the plurality of reference bit lines RBL1, RBL2, . . . RBLn or a plurality of reference source lines (e.g., RSL1, RSL2, . . . , RSLn of FIG. 4), and may be provided to the analog-to-digital converting circuit 400.

Also, the second memory cell array 200 includes at least one offset resistor ROFS. The at least one offset resistor ROFS is implemented in a parallel arrangement. For example, each offset resistor ROFS may be connected between one reference bit line (e.g., RBL1) and one reference source line (e.g., RSL1) corresponding thereto. In other words, one offset resistor is not connected to only one reference bit line or only one reference source line, but may be connected between a pair of signal lines including one reference bit line and one reference source line. Accordingly, the number of offset resistors ROFS may be substantially equal to the number of reference bit lines RBL1, RBL2, . . . , RBLn and the number of reference source lines RSL1, RSL2, . . . , RSLn.

In an embodiment, the plurality of reference resistive memory cells RRMC included in the second memory cell array 200 may include the same resistive element RE as that of the plurality of reference resistive memory cells RMC included in the first memory cell array 100.

In an embodiment, the number of reference bit lines RBL1, RBL2, . . . , RBLn (i.e., the number of reference currents Iref_1, Iref_2, . . . , Iref_n) connected to the second memory cell array 200 may be substantially equal to the number of word lines WL1, WL2, . . . , WLN and the number of reference word lines RWL1, RWL2, . . . , RWLN. For example, it may be N=n, but the inventive concept may not be limited thereto.

In an embodiment, the number of reference bit lines RBL1, RBL2, . . . , RBLn connected to the second memory cell array 200 may be determined based on the number of bits of digital signals DS_1, DS_2, . . . , DS_M which are described below. For example, when the number of bits of each of the digital signals DS_1, DS_2, . . . , DS_M is k bits (k is a natural number), the reference bit lines RBL1, RBL2, . . . , RBLn connected to the second memory cell array 200 may correspond to a number obtained by subtracting 1 from the k square of 2. For example, when the digital signals DS_1, DS_2, . . . , DS_M are respectively 2-bit, 4-bit, and 5-bit digital signals, the second memory cell array 200 may be connected to 3, 15 and 31 reference bit lines. In another example, when each of the digital signals DS_1, DS_2, . . . , DS_M is a 1-bit digital signal, the second memory cell array 200 may be connected to one reference bit line differently from that illustrated in FIG. 1A.

According to various embodiments, the second memory cell array 200 may further include cells of at least one redundancy column and/or at least one redundancy row. The at least one redundancy column may operate by replacing a column in which a fault is detected among columns of the second memory cell array 200. The at least one redundancy row may operate by replacing a row in which a fault is detected among rows of the second memory cell array 200. The at least one redundancy column and the at least one redundancy row of the second memory cell array 200 are described below.

The word line driver 300 may drive the plurality of word lines WL1, WL2, . . . , WLN connected to the first memory cell array 100, and may drive the plurality of reference word lines RWL1, RLW2, . . . , RWLN connected to the second memory cell array 200.

For example, in an arithmetic operation of the neuromorphic computing device 20, the word line driver 300 may drive the plurality of word lines WL1, WL2, . . . , WLN so that at least one selected from the plurality of word lines WL1, WL2, . . . , WLN may be activated according to element values of an input feature vector. For example, when each element of the input feature vector having a length N has a value of '1' or '0', the word line driver 300 may drive the plurality of word lines WL1, WL2, . . . , WLN so that a word line corresponding to a position of the element having the value of '1' may be activated.

For example, the word line driver 300 may activate the plurality of reference word lines RWL1, RLW2, . . . , RWLN so that all of the plurality of reference word lines RWL1, RLW2, . . . , RWLN may be activated, during an operation period during which the arithmetic operation of the neuromorphic computing device 20 is performed.

The analog-to-digital converting circuit 400 may convert the plurality of read currents Iread_1, Iread_2, . . . , Iread_M into the plurality of digital signals DS_1, DS_2, . . . , DS_M based on the plurality of reference currents Iref_1, Iref_2, . . . , Iref_n and output the plurality of digital signals DS_1, DS_2, . . . , DS_M. For example, the analog-to-digital converting circuit 400 may convert the plurality of read currents Iread_1, Iread_2, . . . , Iread_M into the plurality of digital signals DS_1, DS_2, . . . , DS_M, by using the plurality of reference currents Iref_1, Iref_2, . . . , Iref_n as a reference for analog-to-digital conversion. For example, the analog-to-digital converting circuit 400 may include a plurality of analog-to-digital converters, and according to an embodiment, the number of analog-to-digital converters may be the same as the number of input read currents, or may be less than the number of input read currents. A detailed structure of the analog-to-digital converting circuit 400 is described below with reference to FIG. 7. The analog-to-digital converting circuit 400 may provide the plurality of digital signals DS_1, DS_2, . . . DS_M to the adder circuit 500.

According to an embodiment, although not shown, the neuromorphic computing device 20 may further include a current-voltage converting circuit disposed between the first and second memory cell arrays 100 and 200 and the analog-to-digital converting circuit 400. The current-voltage converting circuit may convert the plurality of read currents Iread_1, Iread_2, . . . , Iread_M and the plurality of reference currents Iref_1, Iref_2, . . . , Iref_n respectively into a plurality of signal voltages and a plurality of reference voltages, and in this case, the analog-to-digital converting circuit 400 may perform analog-to-digital conversion based on the plurality of signal voltages and the plurality of reference voltages.

The adder circuit 500 may generate output data ODAT by performing accumulation and/or summation operations based on the plurality of digital signals DS_1, DS_2, . . . , DS_M. For example, the adder circuit 500 may generate a plurality of pieces of output data ODAT_1, ODAT_2, . . . , ODAT_m (m is a natural number greater than or equal to 2) based on the plurality of digital signals DS_1, DS_2, . . . , DS_M. For example, it may be M=m, but the inventive concept may not be limited thereto. In an embodiment, the adder circuit 500 may include at least one adder and at least one shift register.

In general, the plurality of resistive memory cells RMC included in the first memory cell array 100 have temperature and time dependences. For example, the resistive element RE included in each of the plurality of resistive memory cells RMC may have a temperature dependence in which resistance decreases when the temperature increases and the resistance increases when the temperature decreases. In addition, the resistive element RE may have a retention characteristic in which the resistance decreases over time, or in some cases, may have the time dependence, such as having a drift characteristic in which the resistance increases when a certain time passes after data is written. Accordingly, the plurality of read currents Iread_1, Iread_2, . . . , Iread_M output from the first memory cell array 100 may depend on temperature and time, and for accurate data storage and operation, it is necessary to reduce or remove effects of temperature and time dependencies.

The neuromorphic computing device 20 according to some embodiments may convert the plurality of read currents Iread_1, Iread_2, . . . , Iread_M into the plurality of digital signals DS_1, DS_2, . . . , DS_M using the plurality of reference currents Iref_1, Iref_2, . . . , Iref_n output from the second memory cell array 200 including the same resistive material as that of the resistive element RE included in the first memory cell array 100. The second memory cell array 200 has the same temperature and/or time dependence as that of the first memory cell array 100, and thus, a reduction in the accuracy of inference of the neuromorphic computing device 20 according to the temperature and/or time dependences of the plurality of resistive memory cells RMC may be prevented. Accordingly, the reliability of the accuracy of calculation or inference of the neuromorphic computing device 20 may be increased.

In addition, the neuromorphic computing device 20 according to some embodiments may include at least one offset resistor ROFS in which the second memory cell array 200 is implemented in a parallel arrangement. In this case, the offset resistor ROFS may be formed to have the same resistance value for each column of the second memory cell array 200, and thus, processing implementation may be easy, and the maximum sensing margin may be secured. Accordingly, the sensing performance of the neuromorphic computing device 20 may be improved.

Figure 1B:
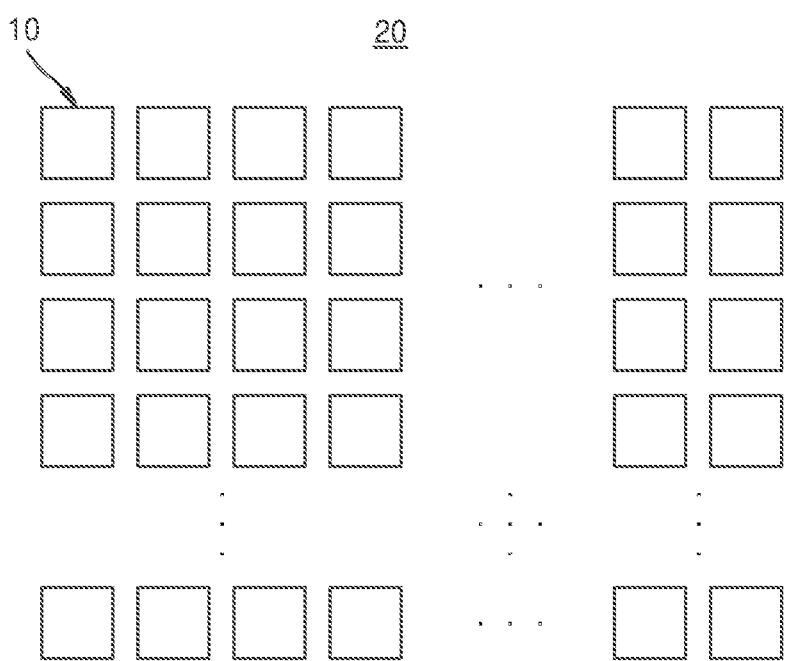
FIG. 1B illustrates a neuromorphic computing device according to some embodiments.

FIG. 1B illustrates the neuromorphic computing device 20 according to some embodiments.

Referring to FIG. 1B, the neuromorphic computing device 20 according to an embodiment may include the plurality of sub-arrays 10. Referring to FIG. 1A together, each of the plurality of sub-arrays 10 may include the first memory cell array 100 and the second memory cell array 200. The first memory cell array 100 included in each of the plurality of sub-arrays 10 may store weights included in each of a plurality of layers of a neural network model. For example, the weights may be quantized and stored in the first memory cell arrays 100. The first memory cell array 100 storing the weights may be referred to as a weight array.

In an embodiment, the weights included in one layer among the plurality of layers included in the neural network model may be distributed and stored in at least two or more sub-arrays. In this regard, the at least two or more sub-arrays may be disposed adjacent to each other in the neuromorphic computing device 20.

Each of the plurality of sub-arrays 10 may include a weight array in which a plurality of resistive memory cells are disposed, a reference array in which a plurality of reference resistive memory cells are disposed, a row driver connected to the weight array and the reference array through row lines, an analog-to-digital converter (ADC) circuit connected to a cell array through column lines, etc. As described with reference to FIG. 1A, the row driver may be connected to resistive memory cells and reference resistive memory cells through word lines, and the ADC circuit may be connected to the resistive memory cells and the reference resistive memory cells through a plurality of bit lines and a plurality of source lines. The ADC circuit may include a plurality of ADCs, and the number of the plurality of ADCs may be equal to the number of the plurality of bit lines and the number of the plurality of source lines.

Figure 2A:
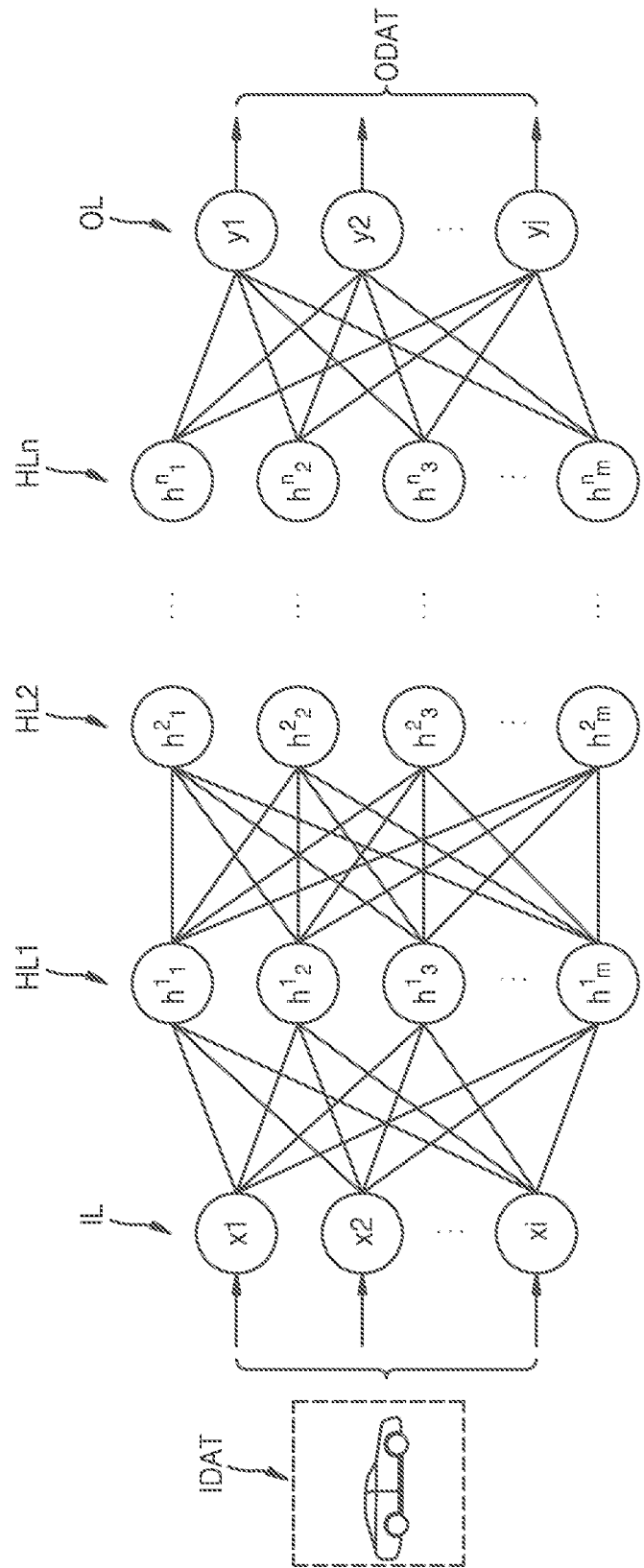
FIGS. 2A and 2B are diagrams illustrating an example of a neural network system driven by a neuromorphic computing device according to some embodiments.
Figure 2B:
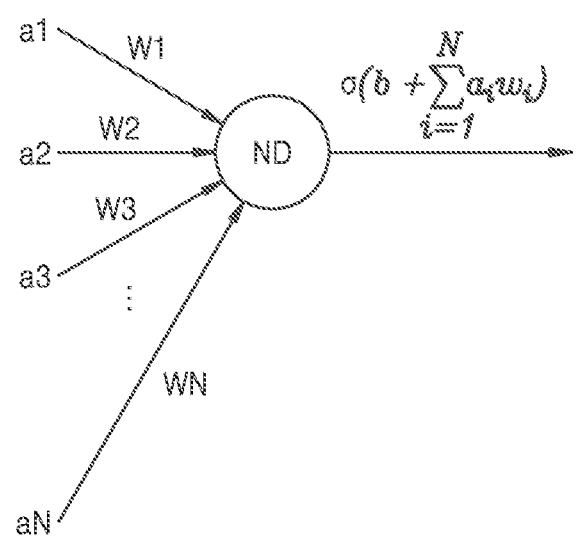

FIGS. 2A and 2B are diagrams illustrating an example of a neural network system driven by the neuromorphic computing device 20 according to some embodiments.

Referring to FIG. 2A, a network structure of a general neural network may include an input layer IL, a plurality of hidden layers HL1, HL2, . . . , HLn, and an output layer OL.

The input layer IL may include i (i is a natural number) input nodes x1, x2, . . . , xi, and vector input data IDAT having length i may be input to respective input nodes.

The plurality of hidden layers HL1, HL2, . . . , HLn may include n (n is a natural number) hidden layers, and hidden nodes h11, h12, h13, . . . , h1m, h21, h22, h23, . . . , h2m, hn1, hn2, hn3, . . . , hnm. For example, the hidden layer HL1 may include m (m is a natural number) hidden nodes h11, h12, h13, . . . , h1m, the hidden layer HL2 may include m hidden nodes h21, h22, h23, . . . , h2m, and the hidden layer HLn may include m hidden nodes hn1, hn2, hn3, . . . , hnm.

The output layer OL may include j (j is a natural number) output nodes y1, y2, . . . , yj corresponding to class to be classified, and may output a result (e.g., a score or a class score) for each class with respect to the input data IDAT as the output data ODAT. The output layer OL may be referred to as a fully connected layer, and for example, may represent a probability that the input data IDAT corresponds to a vehicle as a numerical value.

The network structure shown in FIG. 2A may include a branch between two nodes shown as a straight line, and, although not shown, a weight used in each connection. In this regard, nodes in one layer may not be connected, and nodes included in different layers may be completely or partially connected.

Each node (e.g., h11, h12, h13, . . . , h1m) of FIG. 2A may receive outputs of previous nodes (e.g., x1, x2, x3, . . . , xi) and perform an operation, and may output an operation result to subsequent nodes (e.g., h21, h22, h23, . . . , h2m). In this regard, each node may calculate a value to be output by applying an input value to a specific function, for example, a nonlinear function.

In general, the network structure of the neural network is previously determined, and the weights according to the connection between nodes are used to calculate appropriate values using data of which correct answer is already known to which class the data belong. As described above, data for which a correct answer is already known is called 'learning data', and a process of determining the weight is called 'learning'. In addition, a group of structures and weights of which independent learning is possible is assumed as a 'model', and a process in which the model of which the weight is determined predicts which class the input data belongs to and outputs a predicted value is called a 'test' process.

FIG. 2B specifically shows an example of an operation performed by one node ND included in the network structure of FIG. 2A.

When N inputs a1, a2, a3, . . . , aN are provided to one node ND, the node ND may respectively multiply and sum the N inputs a1, a2, a3, . . . , aN and N weights w1, w2, w3, . . . , wN corresponding thereto, add an offset b to a summed input value, apply the input value to which the offset b is reflected to a specific function a, and generate one output value (e.g., z).

When one layer included in the network structure shown in FIG. 2A includes M nodes ND shown in FIG. 2B, output values of the one layer may be obtained as shown in Equation 1 below.

$$W*A=Z \qquad \text{[Equation 1]}$$

In [Equation 1], W denotes a weight with respect to all connections included in the one layer, and may be implemented in an M×N matrix form. A denotes the N inputs a1, a2, a3, . . . , aN received from the one layer, and may be implemented in an N×1 matrix form. A is a column vector of N elements. Z denotes M outputs z1, z2, z3, . . . , zM output from the one layer, and may be implemented in the M×1 matrix form. Z is a column vector of M elements. The inputs a1, a2, a3, . . . , aN may be respectively expressed as x, i.e., x1, x2, x3, . . . , xN, and the outputs z1, z2, z3, . . . , zM may be expressed as y, i.e., y1, y2, y3, . . . , yM.

Figure 3A:
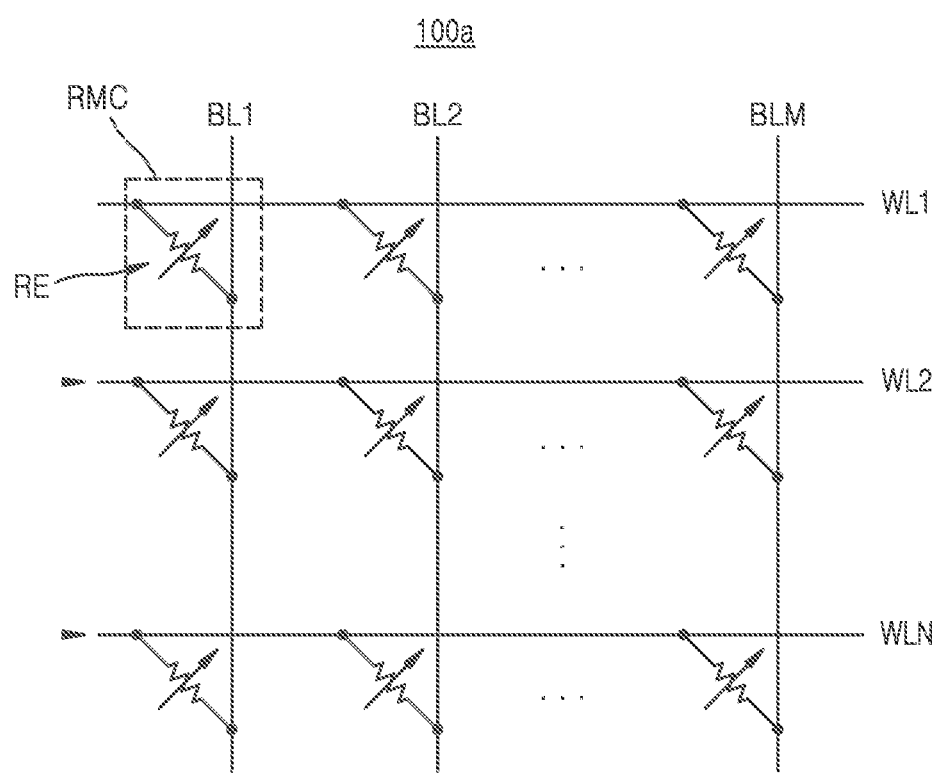
FIGS. 3A, 3B, and 3C are diagrams illustrating examples of first memory cells array included in a neuromorphic computing device according to some embodiments.
Figure 3B:
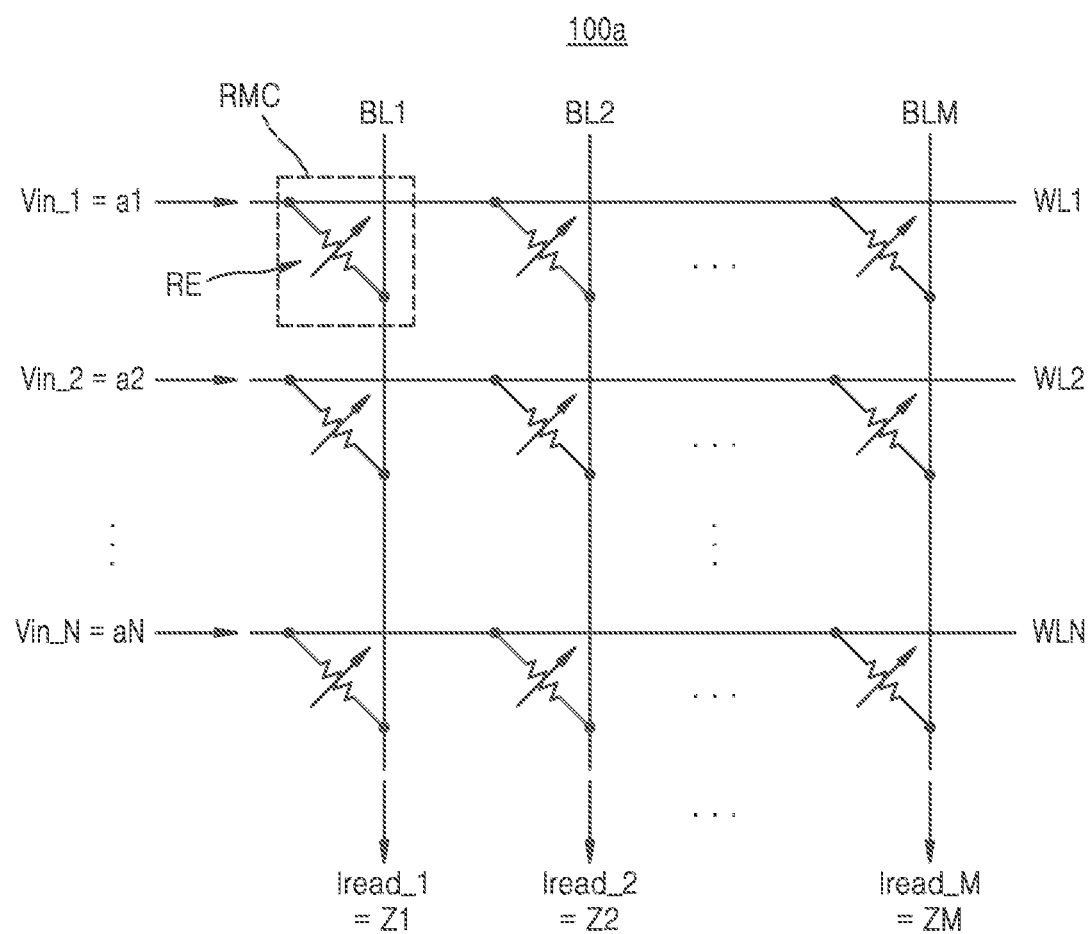
Figure 3C:
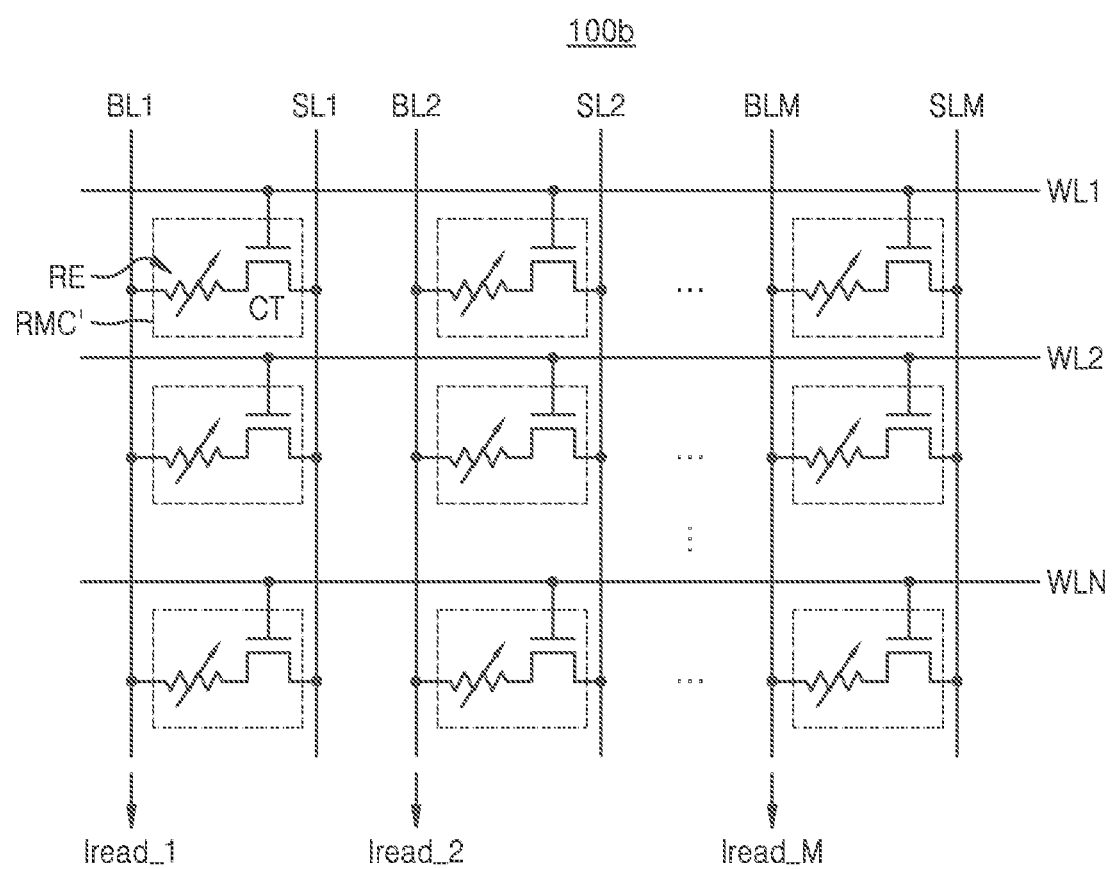

FIGS. 3A, 3B, and 3C are diagrams illustrating examples of first memory cell arrays 100a and 100b included in a neuromorphic computing device according to some embodiments.

Referring to FIG. 3A, the first memory cell array 100a may include the plurality of resistive memory cells RMC disposed in regions where the plurality of word lines WL1, WL2, . . . WLN intersect with the plurality of bit lines BL1, BL2, . . . , BLM. For example, the plurality of word lines WL1, WL2, . . . , WLN may respectively correspond to a plurality of rows, and the plurality of bit lines BL1, BL2, . . . , BLM may respectively correspond to a plurality of columns. Each of the plurality of resistive memory cells RMC may include the resistive element RE, and may be connected to one of the plurality of word lines WL1, WL2, . . . , WLN and one of the plurality of bit lines BL1, BL2, . . . , BLM.

The resistive element RE may have a resistance value changing by a write voltage applied through the plurality of word lines WL1, WL2, . . . , WLN and/or the plurality of bit lines BL1, BL2, . . . , BLM, and the plurality of resistive memory cells RMC may store data by a change in the resistance. For example, when the write voltage is applied to a selected word line, and a ground voltage (e.g., about 0 V) is applied to a selected bit line, data '1' may be written to a selected resistive memory cell, and when the ground voltage is applied to the selected word line, and the write voltage is applied to the selected bit line, data '0' may be written to the selected resistive memory cell. Also, when a read voltage is applied to the selected word line, and the ground voltage is applied to the selected bit line, data written to the selected resistive memory cell may be read.

In an embodiment, each of the plurality of resistive memory cells RMC may be implemented to include any resistive memory cell, such as a phase change random access memory (PRAM) cell, a resistance random access memory (RRAM) cell, a magnetic random access memory (MRAM) cell, a ferroelectric random access memory (FRAM) cell, etc.

In an embodiment, the resistive element RE may include a phase-change material of which crystal state changes according to an amount of current. The phase-change material may use various types of materials such as GaSb, InSb, InSe, Sb2Te3, and GeTe which are combinations of two elements, GeSbTe, GaSeTe, InSbTe, SnSb2Te4, and InSbGe which are combinations of three elements, and AgInSbTe, (GeSn)SbTe, GeSb(SeTe), Te81Ge15Sb2S2 which are combinations of four elements, etc. In another embodiment, the resistive element RE may include perovskite compounds, transition metal oxide, magnetic materials, ferromagnetic materials, or antiferromagnetic materials. However, the resistive materials included in the resistive element RE are not limited to the materials described above.

FIG. 3B shows an example in which the first memory cell array 100a of FIG. 3A performs the operation described above with reference to FIGS. 2A and 2B.

Each of the resistive memory cells RMC corresponds to one synapse or connection of a neural network system, and may store one weight. Therefore, M*N data (or data values) stored in the first memory cell array 100a may correspond to a weight matrix implemented in the M*N matrix form W included in one layer described above with reference to FIGS. 2A and 2B, see W of [Equation 1] above.

N input voltages Vin_1, Vin_2, . . . Vin_N respectively applied through the plurality of word lines WL1, WL2, . . . , WLN may respectively correspond to the N inputs a1, a2, . . . , aN received by the one layer, and may correspond to an input matrix implemented in the N×1 matrix form, that is, A of [Equation 1] above.

M read currents Iread_1, Iread_2, . . . , Iread_M output through the plurality of bit lines BL1, BL2, . . . , BLM may correspond to the M outputs z1, z2, . . . , zM output from the one layer, and may correspond to an output matrix implemented in the M×1 matrix form, that is, Z of [Equation 1] above.

In other words, in a state in which the first memory cell array 100a is implemented using a plurality of weights having a matrix form stored in the plurality of resistive memory cells RMC, when the input signals Vin_1, Vin_2, . . . , Vin_N respectively corresponding to the plurality of input values are respectively input through the plurality of word lines WL1, WL2, ..., WLN, the read currents Iread_1, Iread_2, ..., Iread_M output through the plurality of bit lines BL1, BL2, ..., BLM may be results of multiplication and accumulation operations performed by the neural network system. When all of the plurality of layers of the neural network system are implemented as described above, the neuromorphic computing device that simultaneously performs data storage and computation operations may be implemented.

Referring to FIG. 3C, the first memory cell array 100b may include a plurality of resistive memory cells RMC' disposed in regions where the plurality of word lines WL1, WL2, ..., WLN intersect with the plurality of bit lines BL1, BL2, ..., BLM and the plurality of source lines SL1, SL2, ..., SLM. Hereinafter, redundant descriptions with those of FIG. 3A are omitted.

Each of the plurality of resistive memory cells RMC' may include a cell transistor CT and the resistive element RE, and may be connected to one of the plurality of word lines WL1, WL2, ..., WLN and one of the plurality of bit lines BL1, BL2, ..., BLM, and one of the plurality of source lines SL1, SL2, ..., SLM. For example, the cell transistor CT may include a first electrode connected to one of the plurality of source lines SL1, SL2, ..., SLM, a gate electrode connected to one of the plurality of word lines WL1, WL2, ..., WLN, and a second electrode. The resistive element RE may be connected between the second electrode of the cell transistor CT and one of the plurality of bit lines BL1, BL2, ..., BLM.

For example, when a power voltage (e.g., VCC) is applied to the selected word line, a write voltage is applied to the selected bit line, and a ground voltage is applied to the selected source line, data '1' may be written to the selected resistive memory cell, and when the power voltage is applied to the selected word line, the ground voltage is applied to the selected bit line, and the write voltage is applied to the selected source line, data '0' may be written to the selected resistive memory cell. Also, when the power voltage is applied to the selected word line, a read voltage is applied to the selected bit line, and the ground voltage is applied to the selected source line, data written to the selected resistive memory cell may be read.

Similar to that described above with reference to FIG. 3B, the first memory cell array 100b may output the plurality of read currents Iread_1, Iread_2, ..., Iread_M. FIG. 3C illustrates that the plurality of read currents Iread_1, Iread_2, ..., Iread_M are respectively output through the plurality of bit lines BL1, BL2, ..., BLM, but the inventive concept is not limited thereto, and the plurality of read currents Iread_1, Iread_2, ... Iread_M may be respectively output through the plurality of source lines SL1, SL2, ..., SLM.

Meanwhile, the first memory cell arrays 100a and 100b formed in a two-dimensional array structure is described with reference to FIGS. 3A, 3B, and 3C, but the inventive concept is not limited thereto, and the first memory cell array may be formed in a three-dimensional vertical array structure according to an embodiment. The structure of the resistive memory cell may also be changed according to an embodiment.

Figure 4:
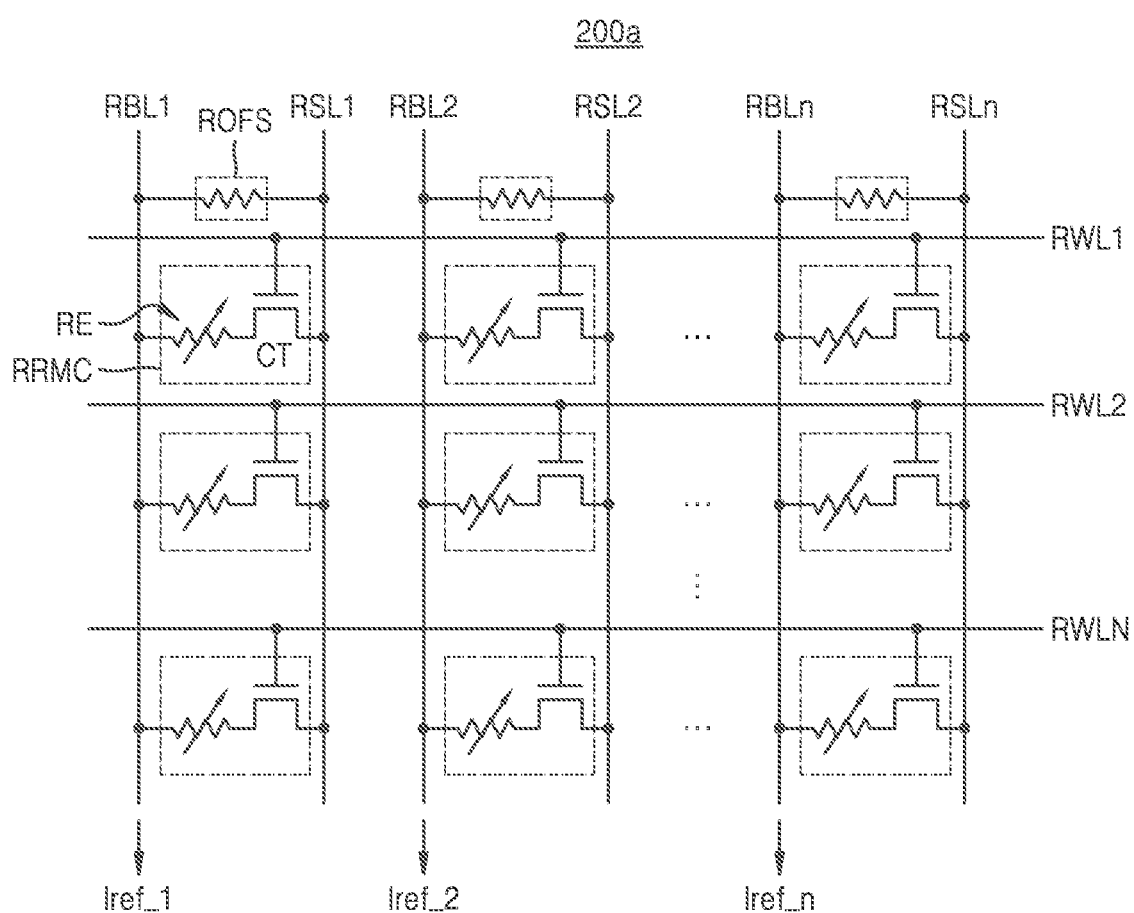
FIG. 4 is a diagram illustrating an example of a second memory cell array included in a neuromorphic computing device according to some embodiments.

FIG. 4 is a diagram illustrating an example of a second memory cell array 200a included in a neuromorphic computing device according to some embodiments.

Referring to FIG. 4, the second memory cell array 200a may include the plurality of reference resistive memory cells RRMC disposed in regions where the plurality of reference word lines RWL1, RWL2, ..., RWLN intersect with the plurality of reference bit lines RBL1, RBL2, ..., RBLn and the plurality of reference source lines RSL1, RSL2, ..., RSLn, and may include the plurality of offset resistors ROFS. The second memory cell array 200a has a structure similar to that of the first memory cell array 100b of FIG. 3C, and redundant descriptions with those of FIG. 3C are omitted.

Each of the plurality of reference resistive memory cells RRMC may include the cell transistor CT and the resistive element RE, and may be connected to one of the plurality of reference word lines RWL1, RWL2, ..., RWLN, one of the plurality of reference bit lines RBL1, RBL2, ..., RBLn, and one of the plurality of reference source lines RSL1, RSL2, ..., RSLn. For example, the cell transistor CT may include a first electrode connected to one of the plurality of reference source lines RSL1, RSL2, ..., RSLn, a gate electrode connected to one of the plurality of reference word lines RWL1, RWL2, ..., RWLN, and a second electrode. The resistive element RE may be connected between the second electrode of the cell transistor CT and one of the plurality of reference bit lines RBL1, RBL2, ..., RBLn.

Each of the plurality of offset resistors ROFS may be connected between one of the plurality of reference bit lines RBL1, RBL2, ..., RBLn and one of the plurality of reference source lines RSL1, RSL2, ..., RSLn. For example, the plurality of offset resistors ROFS may include a first offset resistor connected between the first reference bit line RBL1 and the first reference source line RSL1, a second offset resistor connected between the second reference bit line RBL2 and the second reference source line RSL2, and an n-th offset resistor connected between the n-th reference bit line RBLn and the n-th reference source line RSLn.

In an embodiment, all of the plurality of offset resistors ROFS have substantially the same resistance value, and thus, processing implementation may be easy, and the maximum sensing margin may be secured. A detailed process of determining resistance values of the plurality of offset resistors ROFS is described below with reference to FIGS. 6 to 16.

The second memory cell array 200a may output the plurality of reference currents Iref_1, Iref_2, ..., Iref_n. FIG. 4 illustrates that the plurality of reference currents Iref_1, Iref_2, ..., Iref_n are output through the plurality of reference bit lines RBL1, RBL2, ..., RBLn, but the inventive concept is limited thereto, and the plurality of reference currents Iref_1, Iref_2, ..., Iref_n may be respectively output through the plurality of reference source lines RSL1, RSL2, ..., RSLn.

In an embodiment, when the second memory cell array 200a is implemented as shown in FIG. 4, the first memory cell array 100b may be implemented as shown in FIG. 3C.

Figure 5:
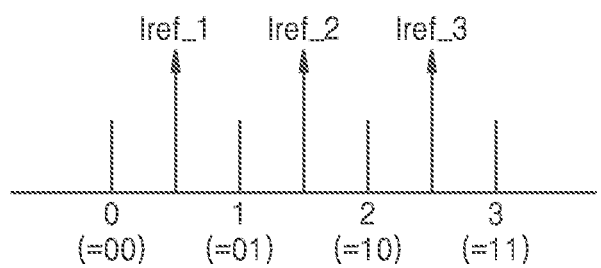
FIG. 5 is a diagram illustrating an operation of an analog-to-digital converting circuit using the second memory cell array of FIG. 4.

FIG. 5 is a diagram illustrating an operation of the analog-to-digital converting circuit 400 using a second memory cell array 200a of FIG. 4.

Referring to FIG. 5, the analog-to-digital converting circuit 400 may convert a read current into a digital signal, using the reference currents Iref_1, Iref_2, and Iref_3.

For example, when the first read current Iread_1 is less than the first reference current Iref_1, the analog-to-digital converting circuit 400 may output '00' as the first digital signal DS_1 corresponding to the first read current Iread_1. When the first read current Iread_1 is greater than or equal to the first reference current Iref_1 and less than the second reference current Iref_2, the analog-to-digital converting circuit 400 may output '01' as the first digital signal DS_1 corresponding to the first read current Iread_1. When the first read current Iread_1 is greater than or equal to the second reference current Iref_2 and less than the third reference current Iref_3, the analog-to-digital converting circuit 400 may output '10' as the first digital signal DS_1 corresponding to the first read current Iread_1. When the first read current Iread_1 is equal to or greater than the third reference current Iref_3, the analog-to-digital converting circuit 400 may output '11' as the first digital signal DS_1 corresponding to the first read current Iread_1.

According to an embodiment, the reference currents Iref_1, Iref_2, and Iref_3 may equally or unequally split the operating voltage range of the analog-to-digital converting circuit 400, by adjusting the number and/or a ratio of cells having a high resist state HRS and cells having a low resist state LRS among the reference resistive memory cells RRMC connected to one reference bit line of the second memory cell array 200a.

Figure 6:
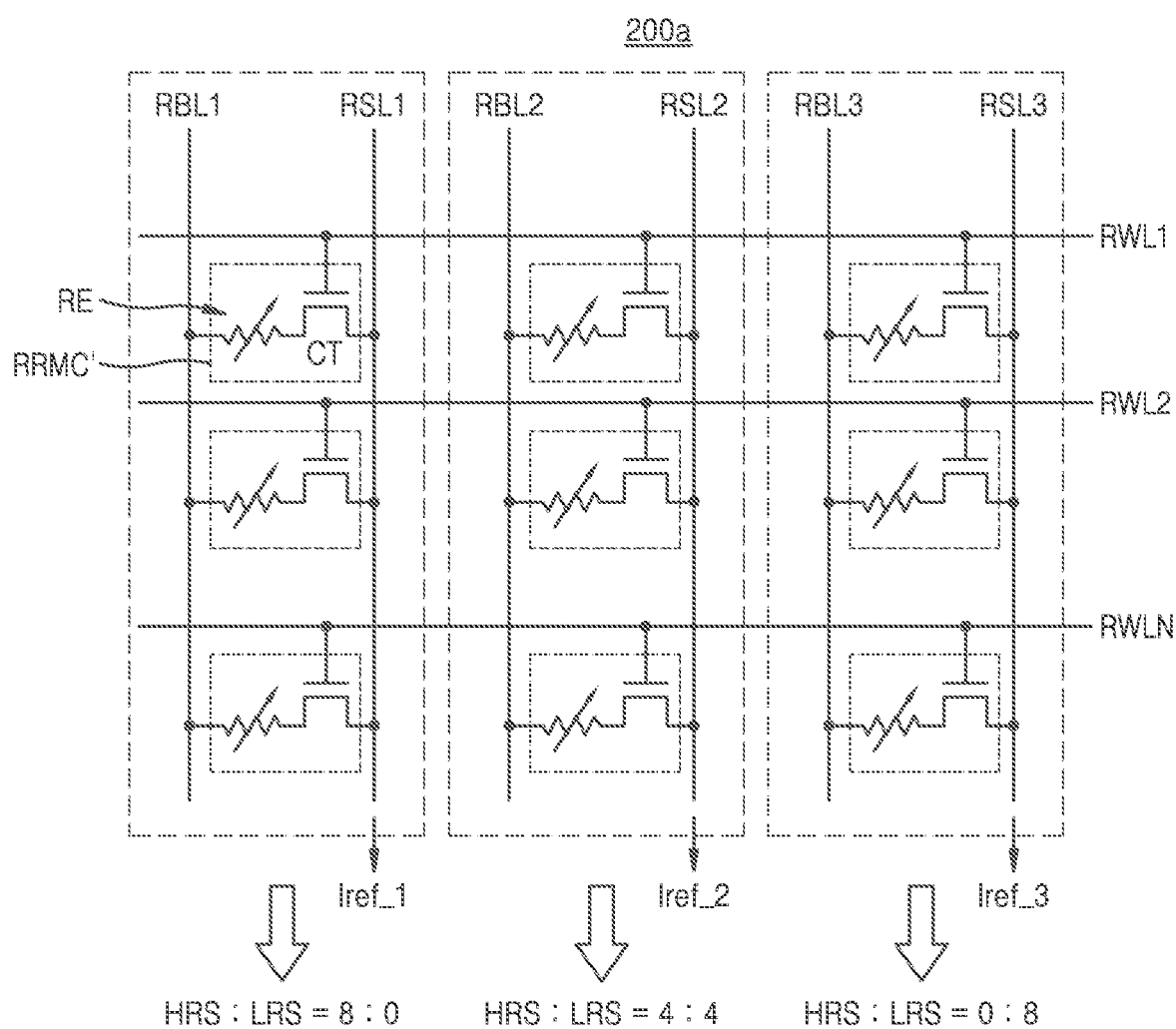
FIG. 6 illustrates states of a second memory cell array and reference memory cells according to an embodiment.

FIG. 6 illustrates states of the second memory cell array 200a and reference memory cells according to an embodiment.

FIG. 6 may illustrate an embodiment in which the number of reference bit lines is 3 in the second memory cell array 200a according to the embodiment of FIG. 5. In particular, FIG. 6 may show an embodiment in which the operating voltage range of an analog-to-digital converting circuit 400 equally splits as shown in FIG. 5. FIG. 6 is described with reference to FIGS. 1A and 5 together.

The second memory cell array 200a may output the first reference current Iref_1 corresponding to the first reference voltage Vref_1 through the first reference source line RSL1. In order for the second memory cell array 200a to have the first reference voltage Vref_1, data may be written such that memory cells having the high resist state HRS are more than memory cells having the low resist state LRS in the reference resistance memory cells connected to the first reference bit line RBL1 corresponding to the first reference source line RSL1. As a non-limiting example, a ratio of the number of memory cells having the high resist state HRS to the number of memory cells having the low resist state LRS may be 8:0 with respect to the reference resistance memory cells connected to the first reference bit line RBL1.

The second memory cell array 200a may output the second reference current Iref_2 corresponding to the second reference voltage Vref_2 through the second reference source line RSL2. In order for the second memory cell array 200 to have the second reference voltage Vref_2, data may be written such that the number of memory cells having the high resist state HRS is the same as the number of memory cells having the low resist state LRS in the reference resistance memory cells connected to the second reference bit line RBL2 corresponding to the second reference source line RSL2. As a non-limiting example, the ratio of the number of memory cells having the high resist state HRS to the number of memory cells having the low resist state LRS may be 4:4 with respect to the reference resistance memory cells connected to the second reference bit line RBL2.

The second memory cell array 200a may output the third reference current Iref_3 corresponding to the third reference voltage Vref_3 through the third reference source line RSL3. In order for the second memory cell array 200a to have the third reference voltage Vref_3, data may be written such that memory cells having the high resist state HRS are fewer than memory cells having the low resist state LRS in the reference resistance memory cells connected to the third reference bit line RBL3 corresponding to the third reference source line RSL3. As a non-limiting example, the ratio of the number of memory cells having the high resist state HRS to the number of memory cells having the low resist state LRS may be 0:8 with respect to the reference resistance memory cells connected to the third reference bit line RBL3.

As described above, in order for the second memory cell array 200a to output reference currents respectively corresponding to reference voltages of different levels, a ratio of memory cells having the low resist state LRS with respect to memory cells having the high resist state HRS may be different depending on a plurality of reference bit lines.

Figure 7:
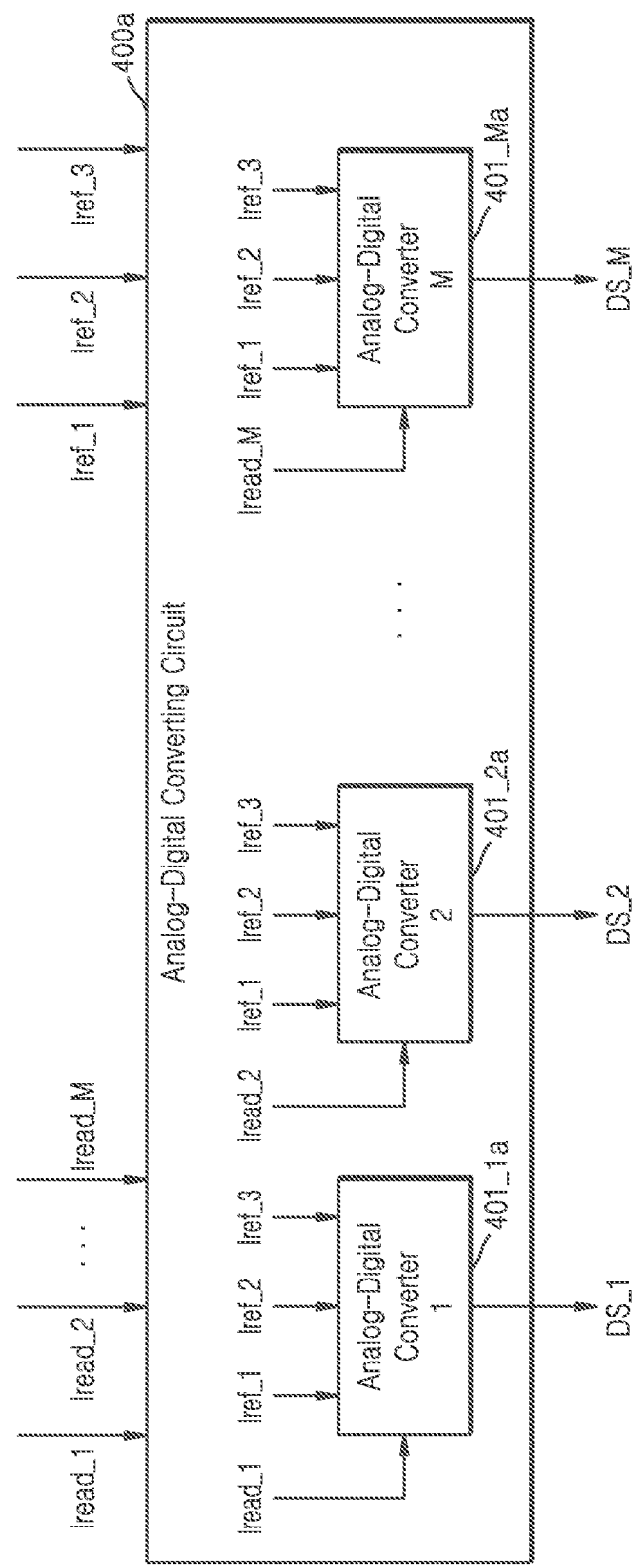
FIG. 7 is a block diagram illustrating an example of an analog-to-digital converting circuit operating using a second memory cell array.

FIG. 7 is a block diagram illustrating an example of an analog-to-digital converting circuit 400a operating using a second memory cell array.

Referring to FIG. 7, the analog-to-digital converting circuit 400a may include a plurality of analog-to-digital converters 401_1a, 401_2a, . . . , 401_Ma. The number of the plurality of analog-to-digital converters 401_1a, 401_2a, . . . , 401_Ma may be substantially the same as the number of the plurality of read currents Iread_1, Iread_2, . . . , Iread_M.

The first analog-to-digital converter 401_1a may convert the first read current Iread_1 based on the reference currents Iref_1, Iref_2, and Iref_3 to generate and output the first digital signal DS_1. Similarly, the second analog-to-digital converter 401_2a may convert the second read current Iread_2 based on the reference currents Iref_1, Iref_2, and Iref_3 to generate and output the second digital signal DS_2. The M-th analog-to-digital converter 401_Ma may convert the M-th read current Iread_M based on the reference currents Iref_1, Iref_2, and Iref_3 to generate and output the M-th digital signal DS_M.

Figure 8A:
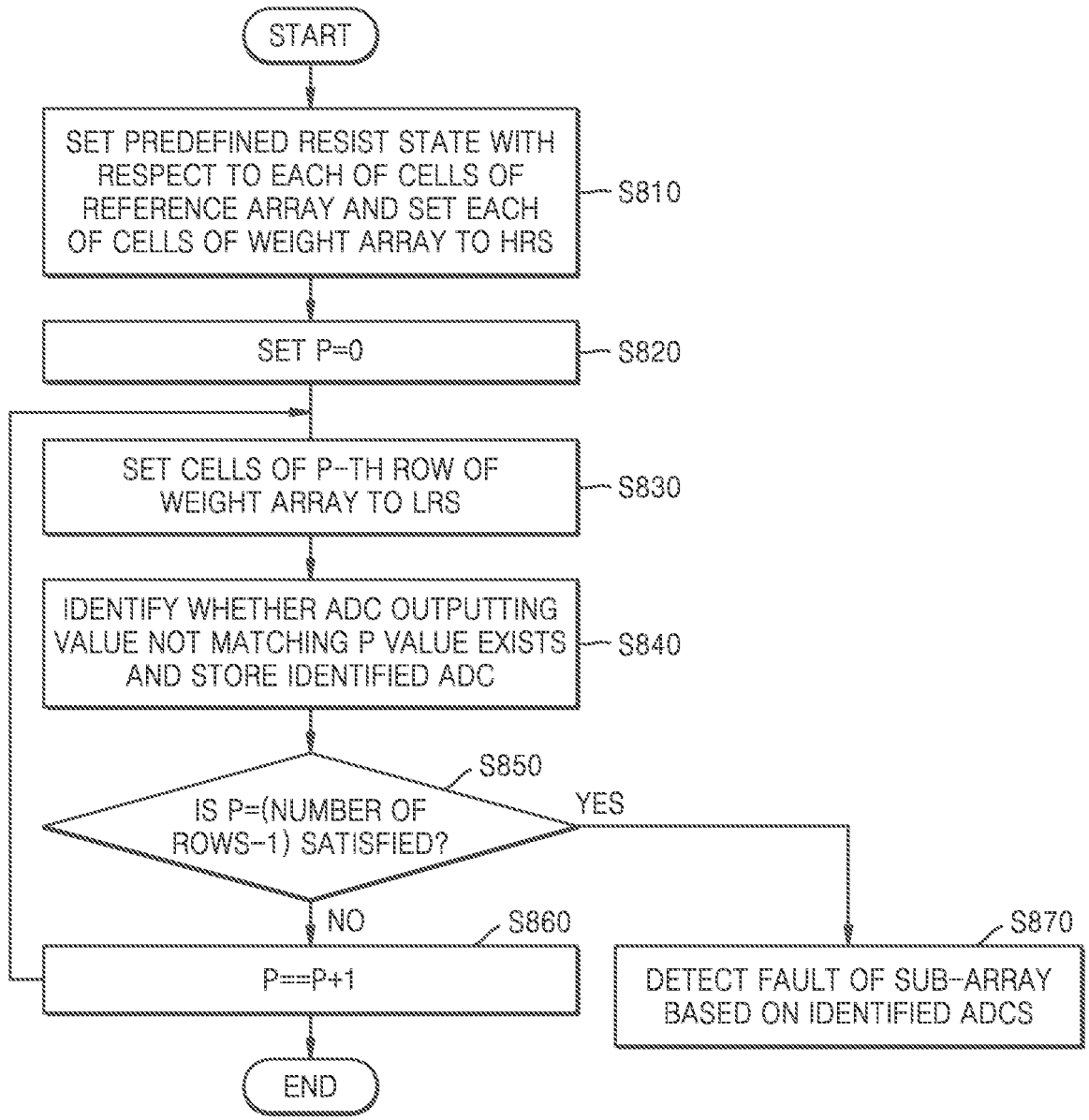
FIG. 8A is a flowchart illustrating a method of detecting a fault of a sub-array according to an embodiment.
Figure 8B:
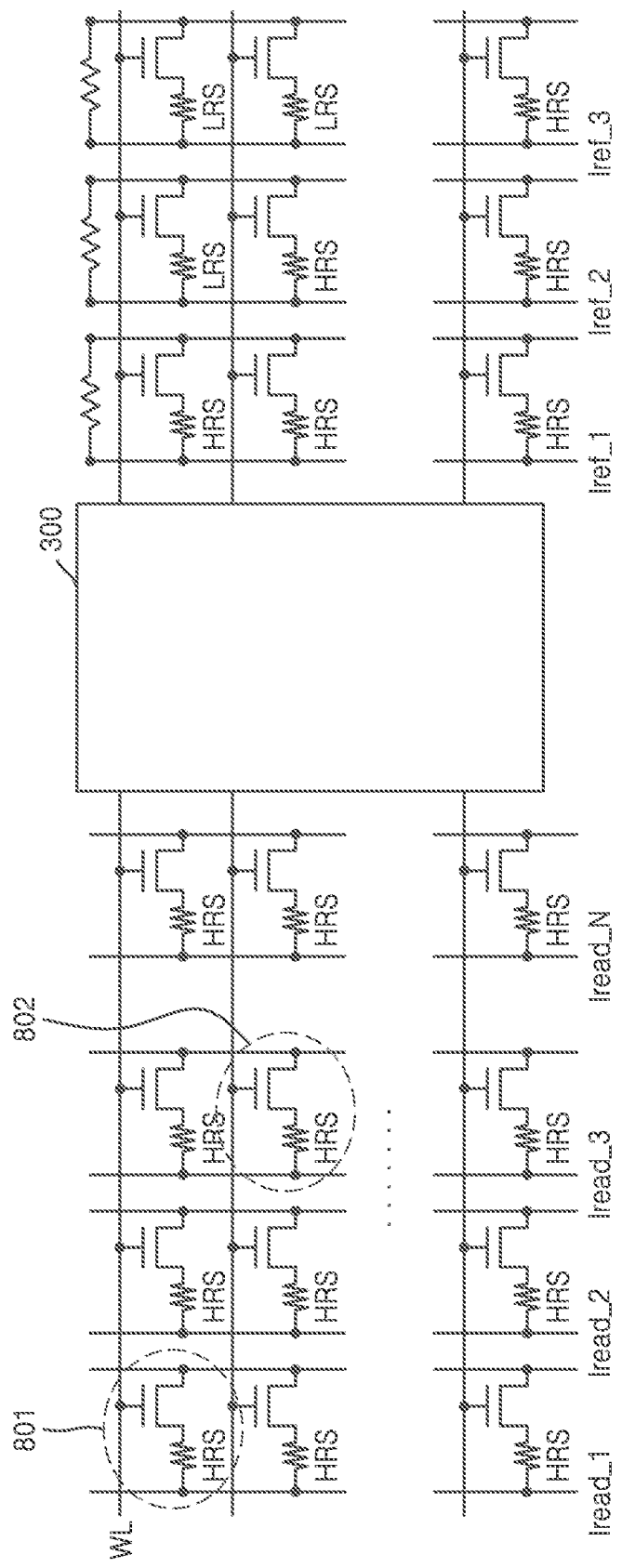
FIGS. 8B and 8C illustrate states of a reference array according to an embodiment.

FIG. 8A is a flowchart illustrating a method of detecting a fault of a sub-array according to an embodiment.

Referring to FIG. 8A, in operation S810, the neuromorphic computing device 20 may set a predefined resist state with respect to each of cells of a reference array (the second memory cell array 200 of FIG. 1A), and set each of cells of a weight array (the first memory cell array 100 of FIG. 1A) to the high resist state HRS.

According to various embodiments, the neuromorphic computing device 20 may set cells of the reference array 200 to detect a fault of the weight array 100 and/or the reference array 200. The neuromorphic computing device 20 may set the resist state of each of the cells of the reference array 200 to output different reference current values for each column. For example, each of cells of a first column outputting the first reference current Iref_1 among columns constituting the reference array 200 may be set to have the high resist state HRS. Only one of cells of a second column adjacent to the first column and outputting the second reference current Iref_2 among the columns constituting the reference array 200 may be set to have the low resist state LRS, and each of the other cells may be set to have the high resist state HRS. Only two of cells of a third column adjacent to the second column and outputting the third reference current Iref_3 among the columns constituting the reference array 200 may be set to have the low resist state LRS, and each of the other cells may be set to have the high resist state HRS. That is, as a non-limiting example, L−1 cells of an L-th column at an L-th position with respect to the left side of the reference array 200 may be set to have the low resist state LRS, and cells of the L-th column other than the L−1 cells may be set to have the high resist state HRS. For example, as a non-limiting example, L−1 cells from a top of an L-th column with respect to a left of the reference array 200 may be set to a low resist state LRS.

According to various embodiments, the neuromorphic computing device 20 may set cells of the weight array 100 to detect a fault of the weight array 100 and/or the reference array 200. The neuromorphic computing device 20 may set each of the cells of the weight array 100 to the high resist state HRS. The setting each of the cells of the weight array 100 to the high resist state HRS is to detect a case in which a cell stuck to a logic high level exists among the plurality of cells of the weight array 100 or there is a bit line that outputs current of a high magnitude regardless of logic values of the cells due to an error occurred.

In operation S820, the neuromorphic computing device 20 may set a P value to 0. The P value may correspond to a value for counting the number of repetitions of changing the resist state with respect to a plurality of rows in order to detect the fault of the weight array 100 or the reference array 200.

In operation S830, the neuromorphic computing device 20 may set the cells of a P-th row of the weight array 100 to the low resist state LRS. For example, because P=0, in operation S820, the neuromorphic computing device 20 may maintain the weight array 100 that is set to the high resist state HRS.

In operation S840, the neuromorphic computing device 20 may identify whether an ADC outputting a value not matching the P value exists, and store the identified ADC. For example, referring to FIG. 8B together, when the P value is 0, all cells of the weight array 100 may be set to the high resist state HRS. In this regard, a bit flip may occur in a first cell 801. That is, the previously stored high resist state HRS may be changed to the low resist state LRS based on a defect or a fault of the first cell 801. A second cell 802 may be a cell stuck to the low resist state LRS. Although the second cell 802 is programmed to have the high resist state HRS, a resistance value of the second cell 802 may not be always changed from the low resist state LRS.

Although the first read current Iread_1 corresponding to the first column needs to be lower than the first reference current Iref_1, the first read current Iread_1 higher than the first reference current Iref_1 may be output due to the low resist state LRS of the first cell 801. That is, an ADC value of the first column may correspond to 1. Although the third read current Iread_3 corresponding to the third column needs to be lower than the first reference current Iref_1, the third read current Iread_3 higher than the third reference current Iref_3 may be output based on the resistance value of the second cell 802 stuck to the low resist state LRS. That is, an ADC value of the third column may correspond to 1. The neuromorphic computing device 20 may compare whether a value of each of ADCs corresponding to the plurality of columns matches 0 to identify whether a fault has occurred. The neuromorphic computing device 20 may store information about ADCs that output the value that does not match the P value and the P value together.

In operation S850, the neuromorphic computing device 20 may determine whether the P value matches a (number of rows–1) value. When the P value matches the (number of rows–1) value, because iteration for detecting the fault with respect to all the cells of the weight array 100 or the reference array 200 is completed, operation S870 may be performed. When the P value does not match the (number of rows–1) value, the neuromorphic computing device 20 may proceed to operation S860 to increase the P value by 1. Thereafter, the neuromorphic computing device 20 may repeatedly perform operations S830 to S860 until the P value matches the (number of rows–1) value.

Figure 8C:
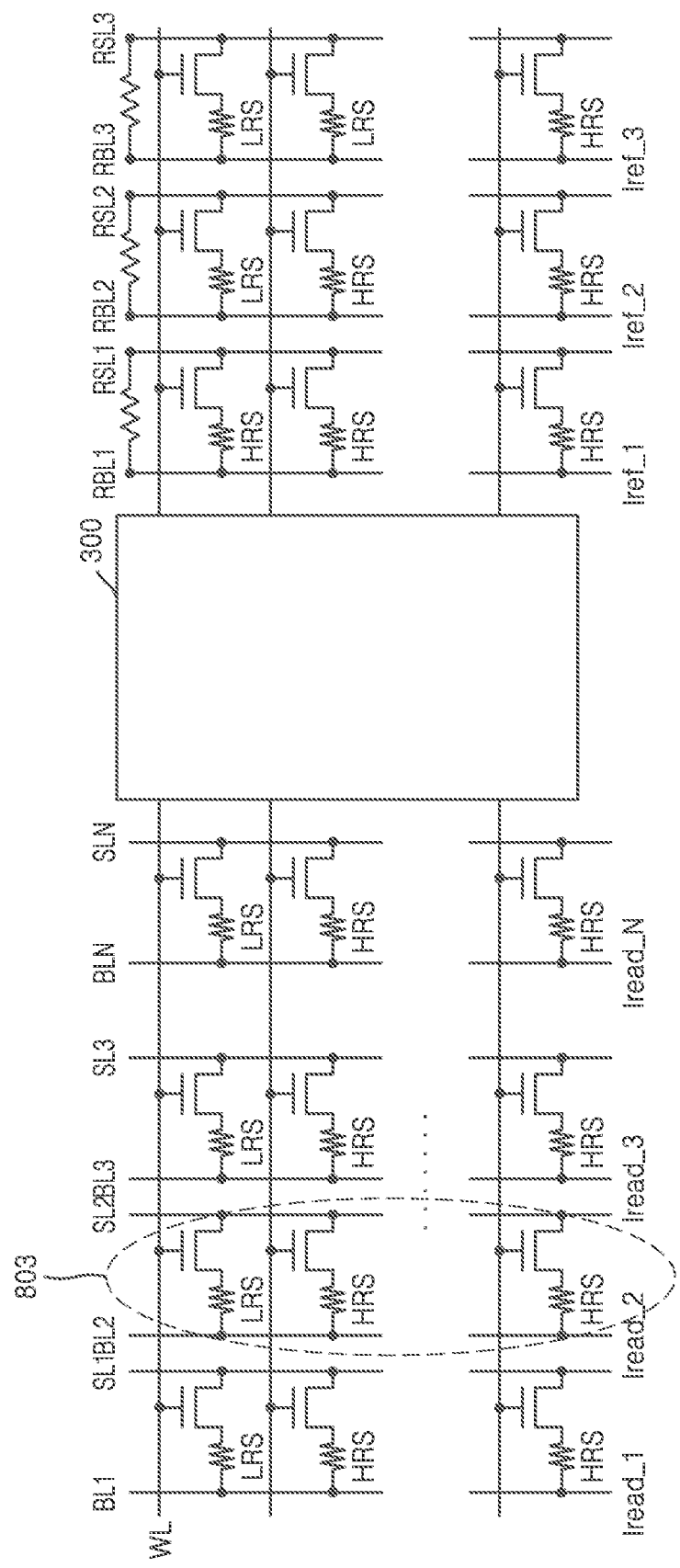

That is, in operation S860, the P value may be increased from 0 to 1. Thereafter, the neuromorphic computing device 20 may return to operation S830 to set cells of a P-th row of the weight array 100 to the low resist state LRS. Referring to FIG. 8C together, the neuromorphic computing device 20 may set cells of a first row to the low resist state LRS. That is, all the columns of the weight array 100 may be changed so that one cell has the low resist state LRS. Thereafter, the neuromorphic computing device 20 may perform operation S840 to identify whether the ADC outputting the value that does not match the P value exists, and store the identified ADC. For example, referring to FIG. 8C together, when the P value is 1, one cell for each column of the weight array 100 may be set to the low resist state LRS. Accordingly, when the defect or the fault does not occur in the weight array 100, the read currents Iread_1 to Iread_N output from each of all the columns may be higher than the first reference current Iref_1 of FIG. 5 and lower than the second reference current Iref_2, and accordingly, a plurality of ADCs may each output 1. At this time, a column fault may occur in a second column 803. For example, when a bit line of the second column 803 does not operate, the read current Iread_2 may be a current lower than the first reference current Iref_1. That is, an output value of an ADC corresponding to the second column 803 may be 0, and because the P value is 1, the neuromorphic computing device 20 may identify that a fault has occurred in the second column 803. When the P value is 1, the neuromorphic computing device 20 may store that the fault has occurred in the second column 803. The neuromorphic computing device 20 may proceed to operation S850 again to increase the P value to 2 in operation S860 and repeatedly perform the above-described operations because the current P value is 1 and does not match the (number of rows–1) value. That is, when the neuromorphic computing device 20 repeatedly performs operations S830 to S860 (number of rows), tables of FIGS. 9B to 9E may be obtained, respectively. The neuromorphic computing device 20 may detect the fault based on the tables of FIGS. 9B to 9E. A detailed description of a fault detection is described below with reference to FIGS. 9A to 9F.

FIG. 9A is a table illustrating criteria by which the neuromorphic computing device 20 detects a fault according to an embodiment.

Referring to FIG. 9A, the fault may correspond to any one of following three faults. For example, the fault may be any one of a cell fault in which a defect occurs in one cell, a column fault in which a defect occurs in a bit line or a source line, or a row fault in which a defect occurs in a word line. Also, the fault corresponding to any one of the three faults may occur in the weight array 100 or in the reference array 200.

Referring to FIG. 9B together, ADC values according to a P value when a fault does not occur are shown. When neither the weight array 100 nor the reference array 200 has a defect and operates normally, the table of FIG. 9B may be obtained. For example, when P is 0, ADC values of each of columns may output 0 equal to the P value. When P is 1, ADC values of each of the columns may output 1 equal to the P value. When P is (number of rows (e.g., M)–1), ADC values of each of the columns may output (M–1) equal to the P value.

According to an embodiment, the cell fault may occur in any one of the cells of the weight array 100. Referring to FIG. 9C together, when P is 0, the ADC of a first column may output 1. For example, a bit flip may occur in a cell of a first row among cells of the first column. For another example, the cell in the first row among cells in the first column may be a cell stuck to the low resist state LRS. Because cells of a second column to an N-th column are all set to the high resist state HRS (P=0), ADC values of the second column to the N-th column may be 0. Because a fault has occurred in one of the cells of the first column, the ADC of the first column may output 1. For example, when P is 1, cells of the first row may be changed to the low resist state LRS. Because the cell of the first row among the cells of the first column is a cell stuck to the low resist state LRS, when P is 1, all ADC values may be normally output. The neuromorphic computing device 20 may identify that an error occurs with respect to only the ADC corresponding to a column Column 1 and the first row (P=0) in which the cell fault occurs.

According to an embodiment, a fault may occur in the second column in the weight array 100. For example, a source line or a bit line corresponding to the second column of the weight array 100 may not operate. Referring to FIG. 9D together, because the source line or bit line corresponding to the second column does not operate, when P is 0, the second read current Iread_2 may be 0. Even if cells of the weight array 100 are changed while repeatedly increasing P by 1, because the second read current Iread_2 is not generated, ADC values may always be 0. That is, when an error occurs in all ADC values of a specific column, the neuromorphic computing device 20 may identify that the column fault has occurred in the specific column.

Figure 9E:
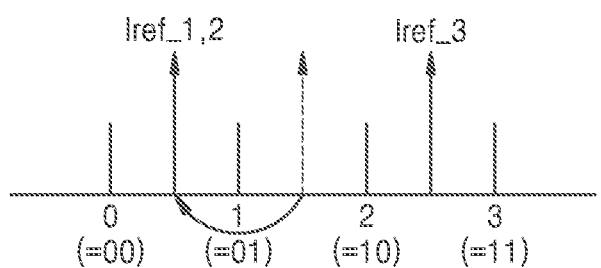
Figure 9F:
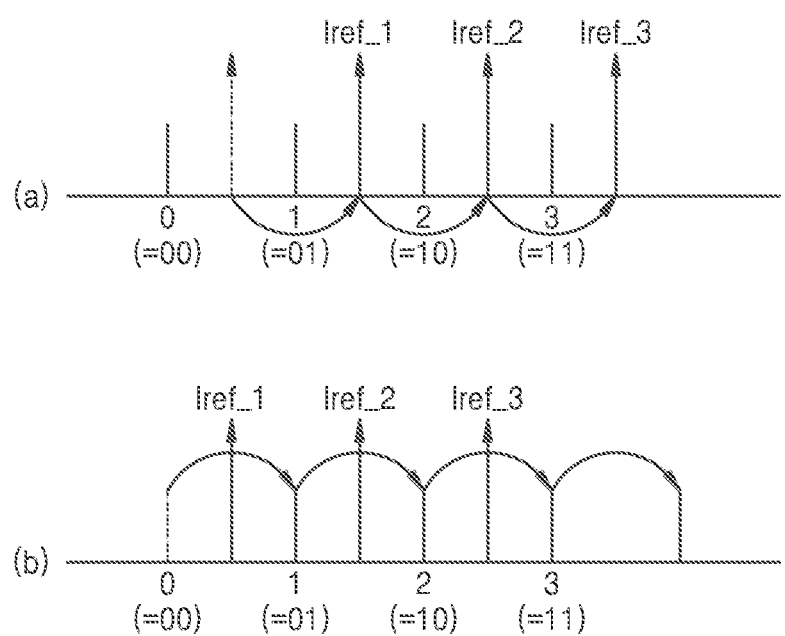
FIG. 9F is a diagram illustrating a shift of a reference current or a read current when a row fault has occurred according to an embodiment.

According to an embodiment, the cell fault or the column fault may occur in the reference array 200. For example, the cell fault may occur in at least one of the cells of the second column of the reference array 200 or the column fault may occur in the entire second column. In this case, the second reference current Iref_2 may be shifted. For example, when the bit line or the source line corresponding to the second column of the reference array 200 does not operate, the second reference current Iref_2 may be shifted to the same value as the value of the first reference current Iref_1. Because the plurality of reference currents Iref_1 to Iref_3 are values, which are targets of comparison for determining the ADC value, when the cell fault or the column fault of the reference array 200 occurs, an error may occur in ADC values of all columns. Referring to FIG. 9E together, when P is 1, an error may occur in all ADC values. That is, when P is 1, when only one of cells included in one column is in the low resist state LRS, a read current may be higher than the first reference current Iref_1 and lower than the second reference current Iref_2. As described above, because the second reference current Iref_2 is shifted to the same value as that of the first reference current Iref_1, an ADC output may be 2 with respect to all columns when P is 1. When an error occurs in ADC values of all columns with respect to a specific P, the neuromorphic computing device 20 may identify that the cell fault or the column fault has occurred in the reference array 200.

According to an embodiment, the row fault may occur in the reference array 200 or the row fault may occur in the weight array 100. For example, referring to FIG. 9F, when a fault occurs in any one of the rows of the reference array 200, all values of the reference currents Iref_1 to Iref_3 may be shifted as shown in (a). For another example, when a fault occurs in any one of the rows of the weight array 100, all values of read currents may be shifted as shown in (b). That is, when the row fault occurs in the weight array 100 or the reference array 200, because of a value of the read current or the reference current, which is the target of comparison for determining the output of the ADC, is changed, an error may occur in all ADCs with respect to all Ps. However, the neuromorphic computing device 20 may only identify that the row fault has occurred, and may not distinguish whether the row fault has occurred in the reference array 200 or in the weight array 100.

Figure 10A:
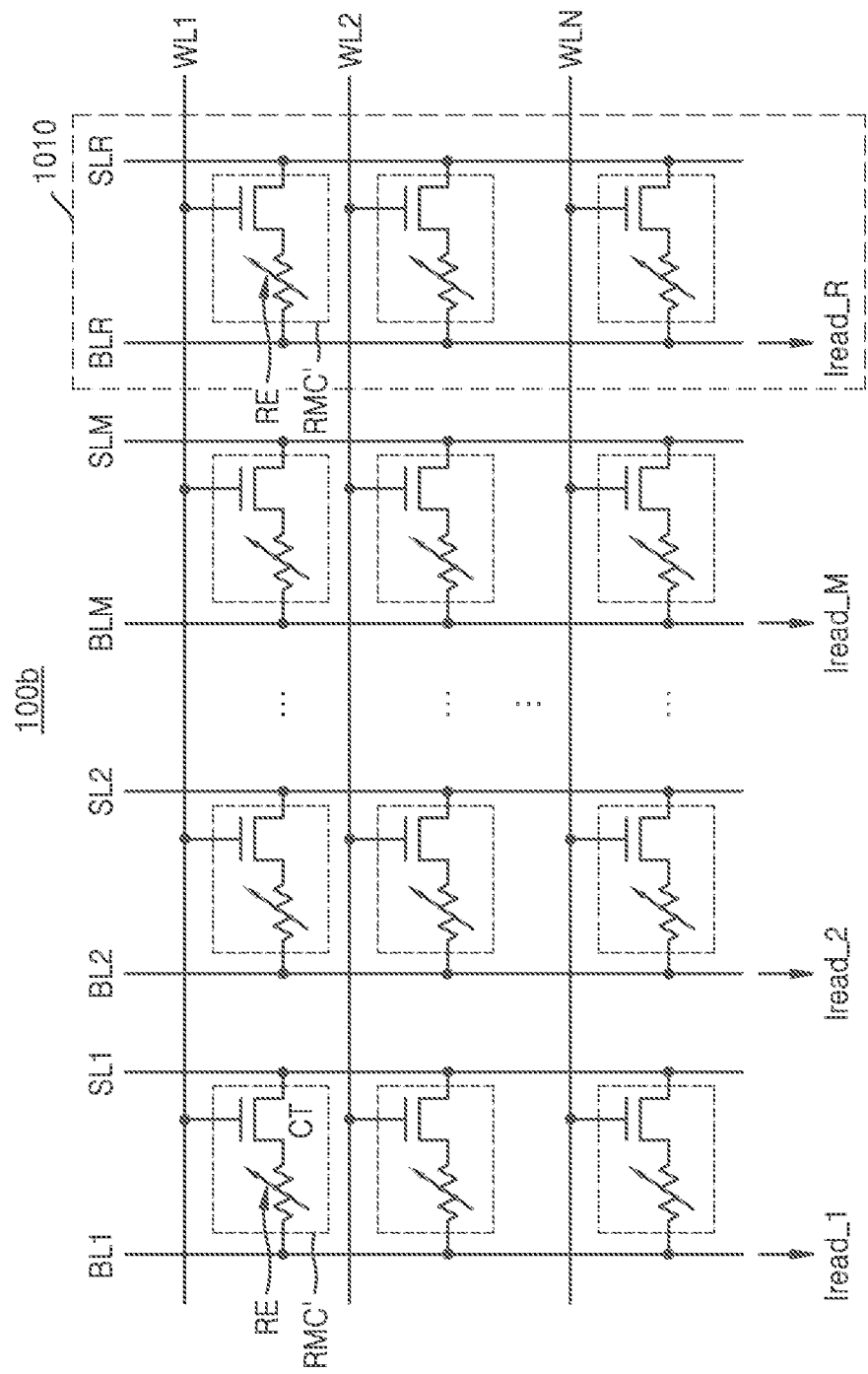
FIG. 10A is a diagram illustrating an example of a weight array including a redundancy row according to an embodiment.

FIG. 10A is a diagram illustrating an example of the weight array 100b included in the neuromorphic computing device 20 according to an embodiment.

Referring to FIG. 10A, the weight array 100b may further include at least one redundancy column. For example, the weight array 100b may further include one redundancy column 1010. The weight array 100b may further include a plurality of resistive memory cells disposed in a region where the redundancy bit line BLR intersect with the redundancy source line SLR corresponding to the redundancy column 1010. Hereinafter, redundant descriptions with those of FIG. 3C are omitted.

Each of the plurality of resistive memory cells RMC' corresponding to the redundancy column 1010 may include the cell transistor CT and the resistive element RE, and may be connected to the redundancy bit line BLR, the redundancy source line SLR, and one of the plurality of word lines WL1, WL2, . . . , WLN. For example, the cell transistor CT may include a first electrode connected to the redundancy source line SLR, a gate electrode connected to one of the plurality of word lines WL1, WL2, . . . , WLN, and a second electrode. The resistive element RE may be connected between the second electrode of the cell transistor CT and one of the redundancy bit lines BLR.

When a fault is not detected in the weight array 100b, the neuromorphic computing device 20 may deactivate the redundancy column 1010. That is, the neuromorphic computing device 20 may ground the redundancy source line SLR to deactivate the redundancy column 1010. Additionally, the neuromorphic computing device 20 may set cells of the redundancy column 1010 to the high resist state HRS to reduce leakage current.

Figure 10B:
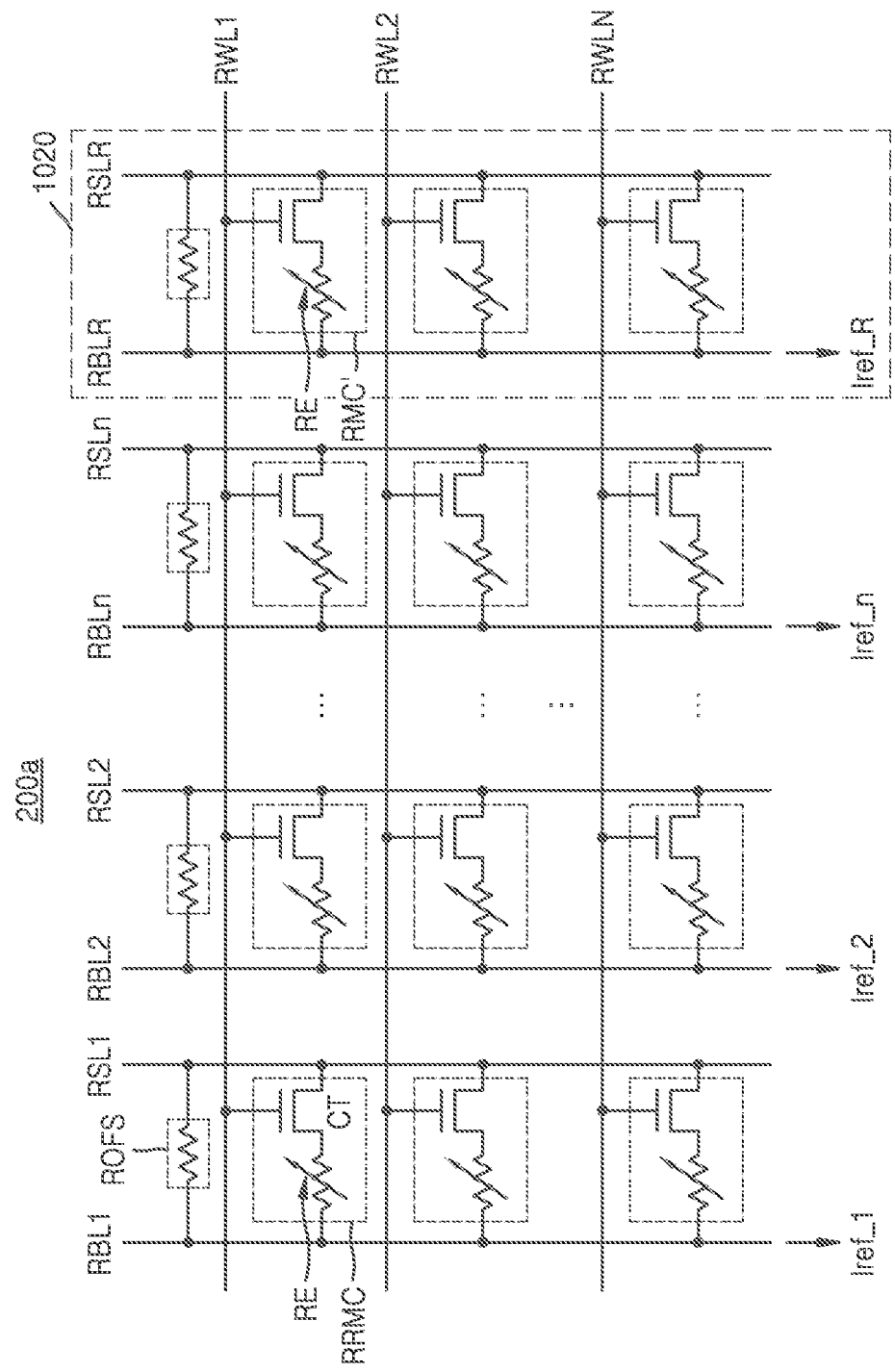
FIG. 10B is a diagram illustrating an example of a reference array including a redundancy reference row according to an embodiment.

FIG. 10B is a diagram illustrating an example of the reference array 200a included in the neuromorphic computing device 20 according to an embodiment.

Referring to FIG. 10B, the reference array 200a may further include at least one redundancy column. For example, the reference array 200a may further include one redundancy column 1020. The reference array 200a may further include a plurality of resistive memory cells disposed in a region where a redundancy reference bit line RBLR intersect with a redundancy reference source line RSLR corresponding to the redundancy column 1020. Hereinafter, redundant descriptions with those of FIG. 3C are omitted.

Each of the plurality of resistive memory cells RMC' corresponding to the redundancy column 1020 may include the cell transistor CT and a resistive element RE, and may be connected to the redundancy reference bit line RBLR, the redundancy reference source line RSLR, and one of the plurality of reference word lines RWL1, RWL2, . . . , RWLN. For example, the cell transistor CT may include a first electrode connected to the redundancy reference source line RSLR, a gate electrode connected to one of the plurality of reference word lines RWL1, RWL2, . . . , RWLN, and a second electrode. The resistive element RE may be connected between the second electrode of the cell transistor CT and one of the redundancy reference bit lines RBLR.

When a fault is not detected in the reference array 200a, the neuromorphic computing device 20 may deactivate the redundancy column 1020. That is, the neuromorphic computing device 20 may ground the redundancy reference source line RSLR to deactivate the redundancy column 1020. Additionally, the neuromorphic computing device 20 may set cells of the redundancy column 1020 to the high resist state HRS to reduce leakage current.

Figure 11:
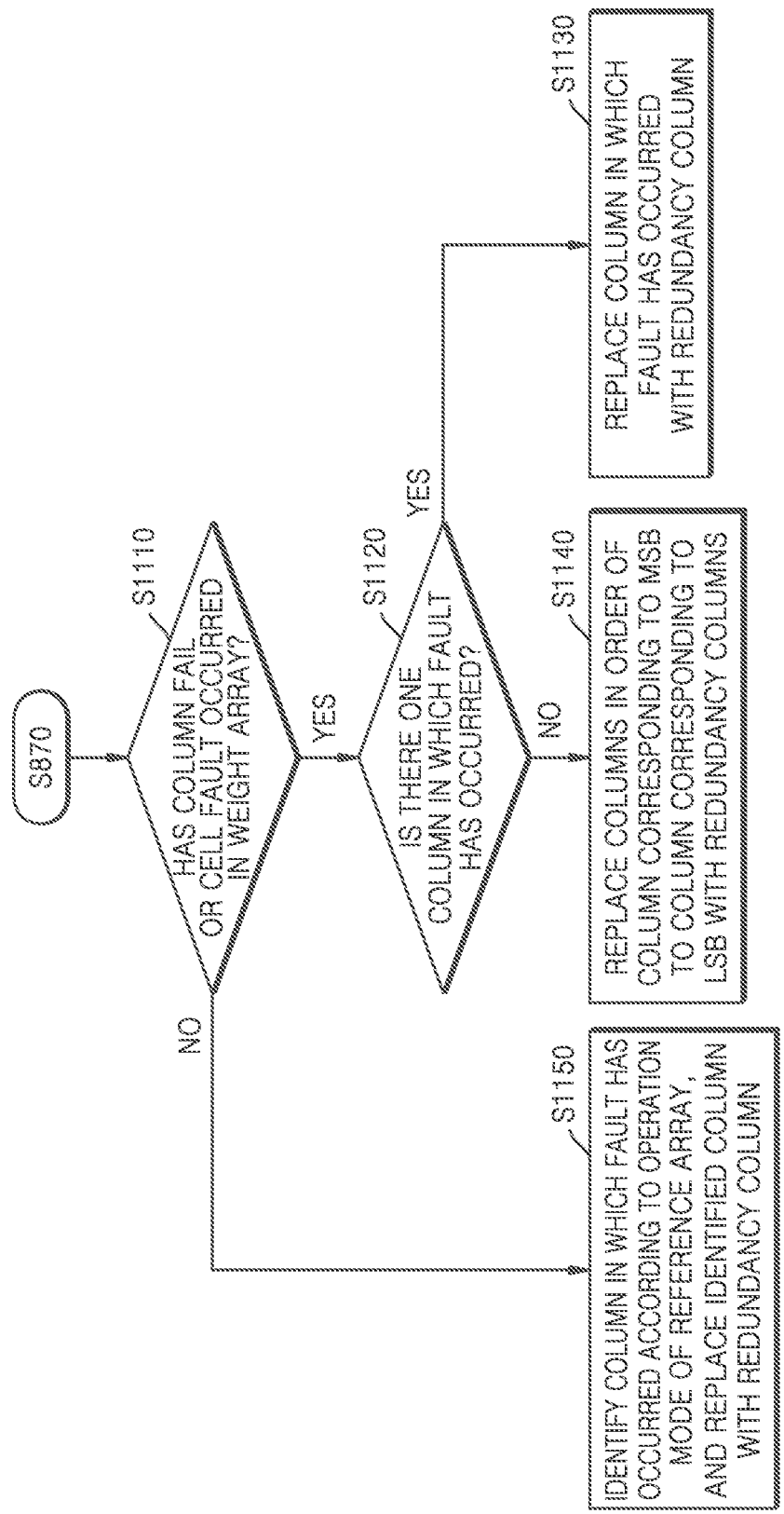
FIG. 11 is a flowchart illustrating a method of repairing a fault according to an embodiment.

FIG. 11 is a flowchart illustrating a method of repairing a fault according to an embodiment.

Referring to FIG. 11, in operation S1110, the neuromorphic computing device 20 may determine whether a column fault or a cell fault has occurred in the weight array 100. The neuromorphic computing device 20 performs a read operation in a column unit other than a cell unit, and thus, even if a cell fault has occurred, the neuromorphic computing device 20 may replace a column with a redundancy column in the same way as when a column fault has occurred. The neuromorphic computing device 20 may identify whether the cell fault or the column fault has occurred in the weight array 100 according to the criteria shown in the table of FIG. 9A.

In operation S1120, the neuromorphic computing device 20 may determine whether there is one column in which a fault has occurred. For example, the neuromorphic computing device 20 may determine whether the number of columns in which an error occurs in an ADC value of a specific P value or an error occurs in ADC values with respect to all P values is one. For example, when there is only one column in which the cell fault or the column fault occurs, in operation S1130, the neuromorphic computing device 20 may replace the column in which the fault has occurred with a redundancy column (e.g., the redundancy column 1020 in FIG. 10B). Specifically, the neuromorphic computing device 20 may program the redundancy column 1020 in the same resist state as programmed in the column in which the fault has occurred to control the redundancy column 1020 to perform the read operation according to a read current of the redundancy column 1020 instead of the column in which the fault has occurred.

In operation S1140, the neuromorphic computing device 20 may replace columns in the order of a column corresponding to a most significant bit (MSB) to a column corresponding to a least significant bit (LSB) with redundancy columns.

The neuromorphic computing device 20 may determine whether there is only one column in which a fault has occurred. For example, the neuromorphic computing device 20 may determine whether the number of columns in which an error occurs in the ADC value of the specific P value or an error occurs in the ADC values with respect to all the P values is one. For example, when there is only one column in which the cell fault or the column fault occurs, the neuromorphic computing device 20 may replace the column in which the fault has occurred with the redundancy column (e.g., the redundancy column 1020 in FIG. 10B). Specifically, the neuromorphic computing device 20 may program the redundancy column 1020 in the same resist state as programmed in the column in which the fault has occurred to control the redundancy column 1020 to perform the read operation according to the read current of the redundancy column 1020 instead of the column in which the fault has occurred. For example, when a stored weight value is 7, three cells, that is, three columns, may be required to store the weight value. According to an embodiment, the number of columns in which a fault has occurred may be greater than the number of redundancy columns. That is, the number of redundancy columns may be insufficient to replace all columns in which a fault has occurred. The neuromorphic computing device 20 may preferentially replace a column storing the MSB among bits constituting the weight value with a redundancy column.

In operation S1150, the neuromorphic computing device 20 may identify a column in which a fault has occurred according to an operation mode of the reference array 200, and replace the identified column with the redundancy column. For example, when an error occurs in all ADC values with respect to the specific P, the neuromorphic computing device 20 may identify that the column fault or the cell fault has occurred in the reference array 200. According to an embodiment, the reference array 200 may operate in a first operation mode and a second operation mode according to a method of determining the read current and the reference current which is a comparison target. For example, the first operation mode may be an operation mode in which the read current is compared with the reference current using an average of column currents of two adjacent columns of the reference array 200. The second operation mode may be an operation mode in which the read current is compared with the reference current using an average of column currents of two columns of the reference array 200 spaced apart from each other. A detailed description of operation S1150 is described below.

Figure 12A:
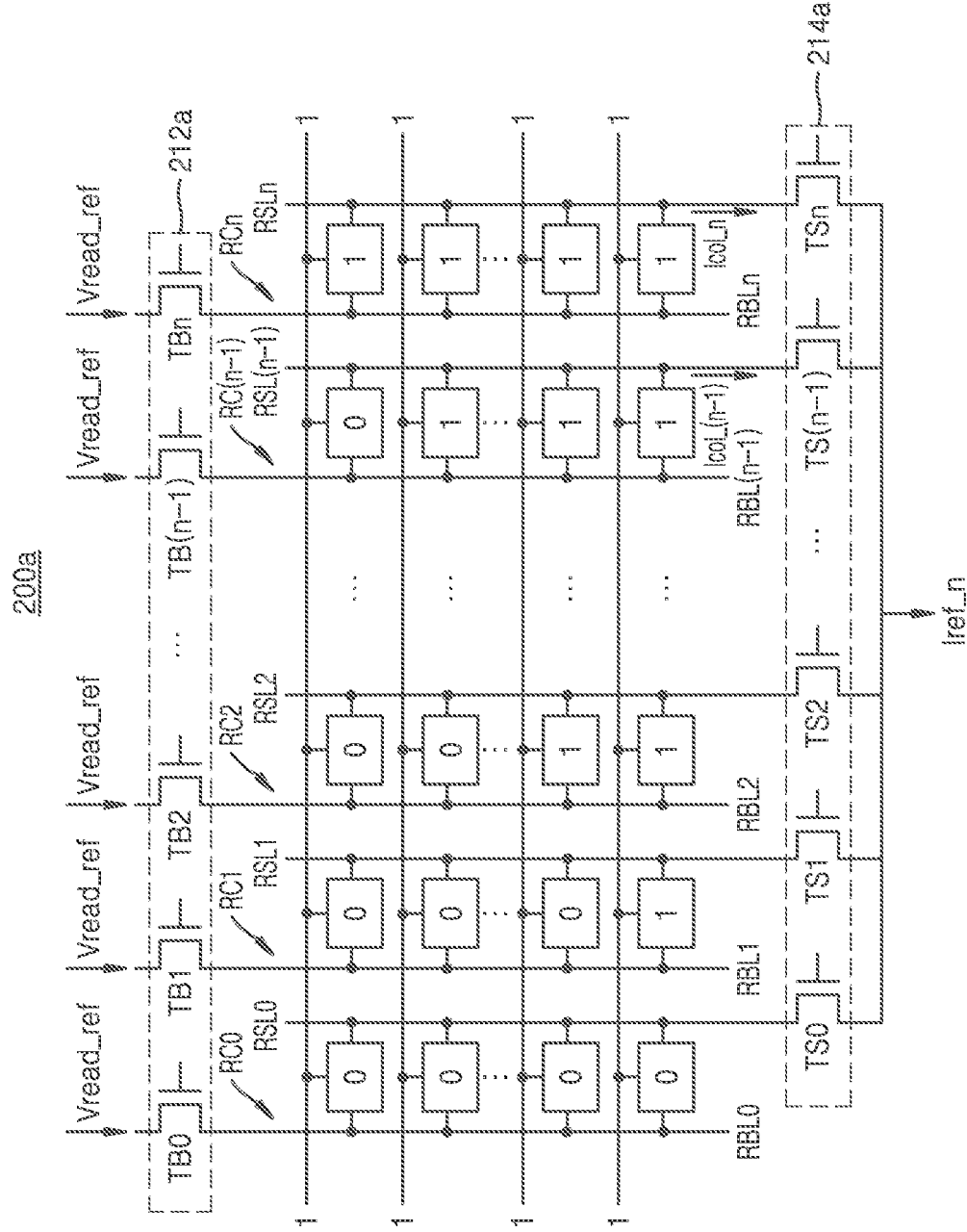
FIG. 12A is a diagram illustrating an operation of a reference array according to an embodiment.

FIG. 12A is a diagram illustrating an operation of the reference array 200a according to an embodiment.

Referring to FIG. 12A, first, data '0' may be written in all of reference resistive memory cells R10, . . . Rn0 included in a first reference column RC0, data '1' may be written in a resistive memory cell Rn1 of reference resistive memory cells R11, . . . Rn1 included in a second reference column RC1 and data '0' may be written in the other resistive memory cells R11, . . . R(n–1)1, data '1' may be written in two reference resistive memory cells R(n–1)2 and Rn2 of reference resistive memory cells R12, . . . Rn2 included in a third reference column RC2, and data '0' may be written in the other resistive memory cells R12, . . . R(n–2)2, data '0' may be written in a resistive memory cell R1(n–1) of reference resistive memory cells R1(n–1), . . . Rn(n–1) included in an n-th reference column RC(n–1) and data '1' may be written in the other resistive memory cells (R2(n–1), . . . Rn(n–1)), and data '1' may be written in all of reference resistive memory cells R1n, . . . Rnn included in an n+1th reference column RCn.

When the first to n-th reference currents Iref_1, . . . Iref_n are to be generated, voltages under a fixed condition may be applied to the first to n-th reference word lines RWL1, . . . RWLn by the word line driver 300. For example, voltages of a first level (e.g., reference word line driving voltages) may be applied to all of the first to n-th reference word lines RWL1, . . . RWLn, and the first level may correspond to a logic high level (e.g., '1').

Thereafter, the reference array 200a may turn on a transistor TB0 of a driving circuit 212a to apply a reference read voltage Vread_ref to the first reference bit line RBL0, and the first reference column RC0 may generate a first column current Icol_0 having a first current level I(0) based on the reference read voltage Vread_ref. Similarly, the reference array 200a may turn on a transistor TB1 to apply the reference read voltage Vread_ref to the second reference bit line RBL1, and the second reference column RC1 may generate a second column current Icol_1 having a second current level I(1) based on the reference read voltage Vread_ref. Also, the reference array 200a may turn on transistors TS0 and TS1 of a driving circuit 214a to average the first and second column currents Icol_0 and Icol_1 and generate the first reference current Iref_1 having a first reference current level Iref(1).

In an embodiment, in order to realize (I(0)+I(1))/2=Iref(1), a voltage level of the reference read voltage Vread_ref applied to the second memory cell array 200a may be about half a voltage level of the read voltage (e.g., Vread) applied to the first memory cell array 100b (i.e., Vread_ref=Vread/2). For example, the read voltage may represent a voltage applied to bit lines of the first memory cell array 100b.

Thereafter, the reference array 200a may turn on the transistor TB1 to apply the reference read voltage Vread_ref to the second reference bit line RBL1, and the second reference column RC1 may generate the second column current Icol_1 having the second current level I(1) based on the reference read voltage Vread_ref. Similarly, the reference array 200a may turn on the transistor TB2 to apply the reference read voltage Vread_ref to the third reference bit line RBL2, and the third reference column RC2 may generate a third column current Icol_2 having a third current level I(2) based on the reference read voltage Vread_ref. In addition, the reference array 200a may turn on the transistors TS1 and TS2 to average the second and third column currents Icol_1 and Icol_2 and generate and output the second reference current Iref_2 having the second reference current level Iref(2).

Thereafter, as shown in FIG. 12A, the reference array 200a may turn on a transistor TB(n−1) to apply the reference read voltage Vread_ref to the n-th reference bit line RBL (n−1), and the n-th reference column RC(n−1) may generate an n-th column current Icol_(n−1) having an n-th current level I(n−1) based on the reference read voltage Vread_ref. Similarly, the reference array 200a may turn on a transistor TBn to apply the reference read voltage Vread_ref to the (n+1)-th reference bit line RBLn, and the (n+1)-th reference column RCn may generate an (n+1)-th column current Icol_n having an (n+1)-th current level I(n) based on the reference read voltage Vread_ref. In addition, the reference array 200a may turn on transistors TS(n−1) and TSn to average the n-th and (n+1)-th column currents Icol_(n−1) and Icol_n and generate and output the n-th reference current level Iref_n having the n-th reference current level Iref(n).

As described above, when the first to n-th reference currents Iref_1, . . . Iref_n are sequentially generated, each reference current may be an average value of two corresponding current levels (or MAC current values), and may be formed in the center between two corresponding current levels at any temperature and time without an offset resistance.

Figure 12B:
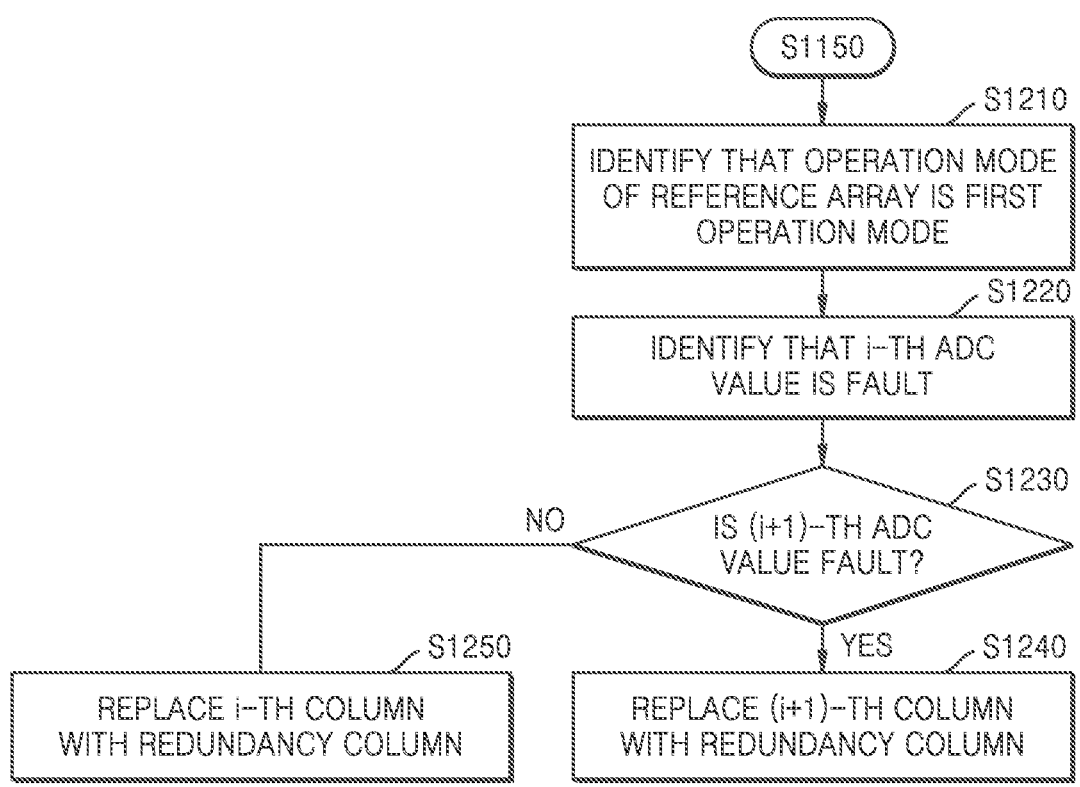
FIG. 12B is a flowchart illustrating a fault repair method of a reference array operating in a first operation mode according to some embodiments.

FIG. 12B is a flowchart illustrating a fault repair method of the reference array 200a operating in a first operation mode according to some embodiments.

Referring to FIG. 12B, in operation S1210, the neuromorphic computing device 20 may identify that an operation mode of the reference array 200a is the first operation mode. The first operation mode may correspond to an operation mode in which a reference current is generated by averaging two adjacent column currents according to FIG. 12A.

In operation S1220, the neuromorphic computing device 20 may identify that an i-th ADC value indicates a fault. When an error occurs in the i-th ADC value, the neuromorphic computing device 20 may identify that a fault has occurred in any one of two column currents constituting a reference current corresponding to an i-th ADC. For example, a fault may have occurred in an i-th column of the reference array 200a or in an (i+1)-th column.

In operation S1230, the neuromorphic computing device 20 may identify whether an (i+1)-th ADC value indicates a fault. When an error occurs in the (i+1)-th ADC value, the neuromorphic computing device 20 may identify that a fault has occurred in any one of two column currents constituting the reference current corresponding to the (i+1)-th ADC, that is, the (i+1)-th column or a (i+2)-th column.

In operation S1240, the neuromorphic computing device 20 may replace the (i+1)-th column with a redundancy column. That is, when a fault occurs in both the i-th ADC value and the (i+1)-th ADC value, the neuromorphic computing device 20 may identify that a fault has occurred in the (i+1)-th column commonly used to generate the reference current. Accordingly, the neuromorphic computing device 20 may replace the (i+1)-th column with the redundancy column. In operation S1250, the neuromorphic computing device 20 may replace the i-th column with the redundancy column. When no fault occurs in the (i+1)-th ADC value, because no fault occurs in the (i+1)-th column and the (i+2)-th column for generating an (i+1)-th reference current, the neuromorphic computing device 20 may replace the i-th column with the redundancy column.

Figure 13:
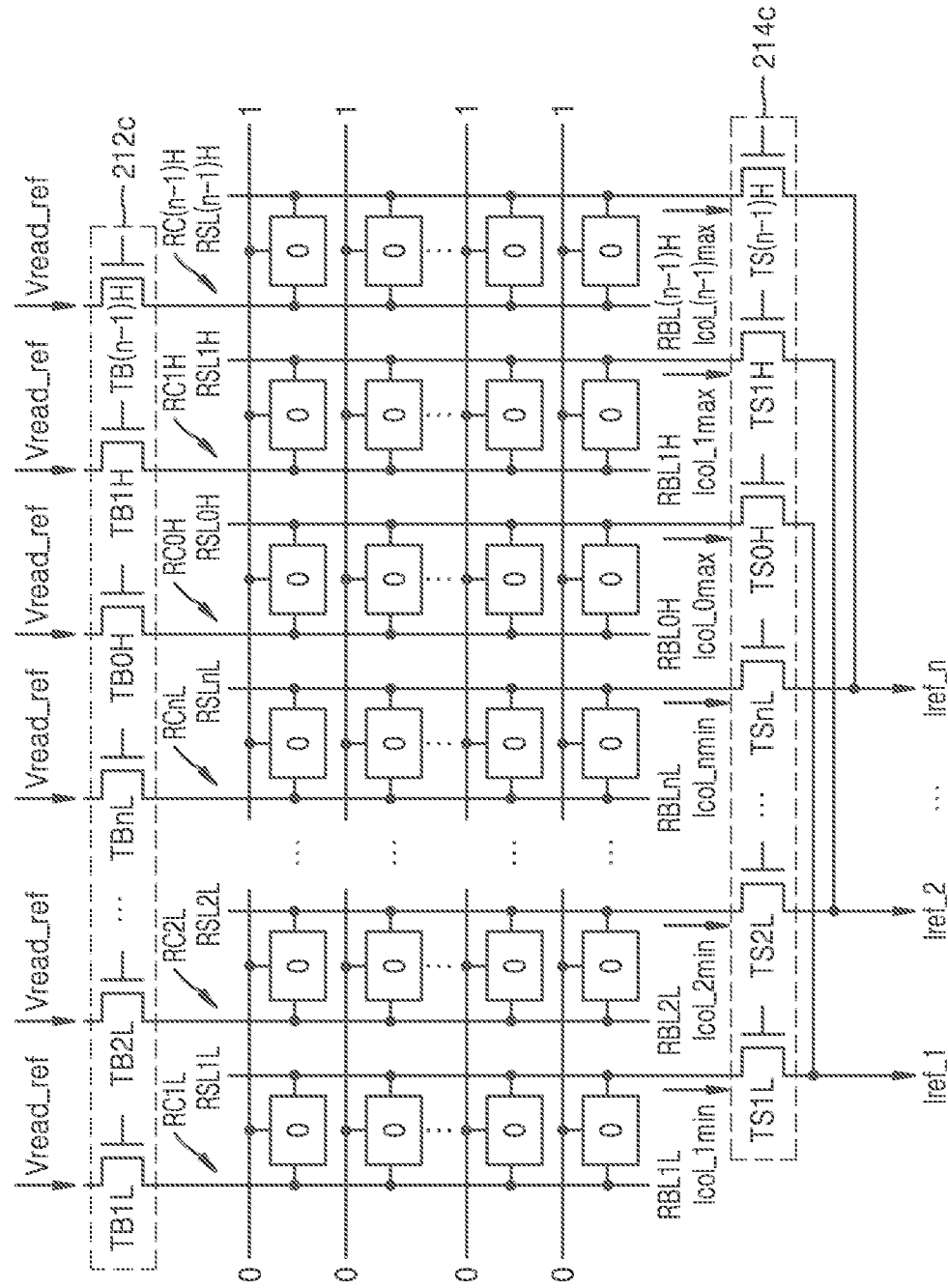
FIG. 13 is a diagram illustrating a reference array operating in a second operation mode according to some embodiments.

FIG. 13 is a diagram illustrating a reference array 200c operating in a second operation mode according to some embodiments.

Referring to FIG. 13, the reference array 200c may include a plurality of reference resistive memory cells R10H, R20H, . . . , R(n−1)0H, Rn0H, R11H, R21H, . . . , R(n−1)1H, Rn1H, . . . , R1(n−1)H, R2(n−1)H, . . . , R(n−1)(n−1)H, Rn(n−1)H, R11L, R21L, . . . , R(n−1)1L, Rn1L, R12L, R22L, . . . , R(n−1)2L, Rn2L, . . . , R1 nL, R2 nL, . . . , R(n−1)nL, and RnnL disposed in regions where a plurality of reference word lines RWL1H, RWL2H, . . . , RWL(n−1)H, RWLnH, RWL1L, RWL2L, . . . , RWL(n−1)L intersect a plurality of reference bit lines RBL0H, RBL1H, . . . , RBL(n−1)H, RBL1L, RBL2L, . . . , RBLnL, and a plurality of reference source lines RSL0H, RSL1H, . . . , RSL(n−1)H, RSL1L, RSL2L, . . . , RSLnL. The reference array 200c may include driving circuits 212c and 214c for an averaging operation.

The plurality of reference word lines RWL1H, . . . RWLnH, RWL1L, . . . RWL(n−1)L may include the first to n-th reference word lines RWL1H, . . . RWLnH and (n+1)-th to (2n−1)-th reference word lines RWL1L, . . . RWL(n−1)L, and the plurality of reference bit lines RBL0H, . . . RBL(n−1)H, RBL1L, . . . RBLnL may include the first to the n-th reference bit lines RBL0H, . . . RBL(n−1)H and the (n+1)-th to the 2n-th reference bit lines RBL1L, . . . RBLnL, and the plurality of reference source lines RSL0H, . . . RSL(n−1)H, RSL1L, . . . RSLnL may include the first to the n-th reference source lines RSL0H, . . . RSL(n−1)H and the (n+1)-th to the 2n-th reference source lines RSL1L, . . . RSLnL. Each of the plurality of reference resistive memory cells R10H, . . . Rn0H, R11H, . . . Rn1H, . . . , R1(n−1)H, . . . Rn(n−1)H, R11L, . . . Rn1L, R12L, . . . Rn2L, . . . , R1 nL, . . . RnnL may have substantially the same structure as that of each of the plurality of resistive memory cells RMC' of FIG. 3C. A driving circuit 212c may include first to n-th transistors TB0H, TB1H, . . . , TB(n−1)H and (n+1)-th to 2n-th transistors TB1L, TB2L, . . . , TBnL, and a driving circuit 214c may include first to n-th transistors TS0H, TS1H, . . . , TS(n−1)H and (n+1)-th to 2n-th transistors TS1L, TS2L, . . . , TSnL.

The reference resistive memory cells R10H, . . . Rn0H connected to the first reference bit line RBL0H and the first reference source line RSL0H may form a first reference column RC0H, the reference resistive memory cells R11H, . . . Rn1H connected to the second reference bit line RBL1H and the second reference source line RSL1H may form a second reference column RC1H, and the reference resistive memory cells R1(n−1)H, . . . Rn(n−1)H connected to the n-th reference bit line RBL(n−1)H and the n-th reference source line RSL(n−1)H may form an n-th reference column RC(n−1)H. In addition, the reference resistive memory cells R11L, . . . Rn1L connected to the (n+1)-th reference bit line RBL1L and the (n+1)-th reference source line RSL1L may form an (n+1)-th reference column RC1L, the reference resistive memory cells R12L, . . . Rn2L connected to the (n+2)-th reference bit line RBL2L and the (n+2)-th reference source line RSL2L may form an (n+2)-th reference column RC2L, and the reference resistive memory cells R1nL, . . . RnnL connected to the 2n-th reference bit line RBLnL and the 2n-th reference source line RSLnL may form a 2n-th reference column RCnL.

According to various embodiments, in order to perform the averaging operation in consideration of the maximum value and the minimum value of a MAC current value, the reference array 200c of FIG. 13 may include the first to n-th reference columns RC0H, . . . RC(n−1)H that generate and output the maximum value of the MAC current value, and the (n+1)-th to the 2n-th reference columns RC1L, . . . RCnL that generate and output the minimum value of the MAC current value. For example, the first to n-th reference columns RC0H, . . . RC(n−1)H may generate first to n-th column currents (e.g., Icol_0max, Icol_1max, . . . , Icol_(n−1)max) having first to n-th current levels I(0), . . . I(n−1) among the first to (n+1)-th current levels I(0), . . . I(n) and corresponding to the maximum value of the MAC current value. The (n+1)-th to the 2n-th reference columns RC1L, . . . RCnL may generate (n+1)-th to 2n-th column currents (e.g., Icol_1 min, Icol_2 min, . . . , Icol_nmin) having second to (n+1)-th current levels I(1), . . . I(n) among the first to (n+1)-th current levels I(0), . . . I(n) and corresponding to the minimum value of the MAC current value.

In addition, in order to generate the first to n-th column currents Icol_0max, . . . Icol_(n−1)max corresponding to the maximum value of the MAC current value and the (n+1)-th to 2n-th column currents Icol_1 min, . . . Icol_nmin corresponding to the minimum value of the MAC current value, the reference array 200c may include the first to n-th reference word lines RWL1H, . . . RWLnH connected to all of the first to n-th reference columns RC0H, . . . RC(n−1)H and some of the (n+1)-th to 2n-th reference columns RC1L, . . . RCnL, and the (n+1)-th to 2n-th reference word lines RWL1L, . . . RWL(n−1)L connected to the remaining ones of the (n+1)-th to 2n-th reference columns RC1L, . . . RCnL. The first to n-th reference word lines RWL1H, . . . RWLnH and the (n+1)-th to (2n−1)-th reference word lines RWL1L, . . . RWL(n−1)L may be electrically separated from each other.

According to various embodiments, the neuromorphic computing device 20 may only repair the first to n-th reference columns RC0H, . . . RC(n−1)H in which word lines are always activated. The (n+1)-th to 2n-th reference columns RC1L, . . . RCnL having different activated word lines for each column may not be replaced with redundancy columns. Accordingly, the neuromorphic computing device 20 may replace a column in which a fault has occurred among the repairable first to n-th reference columns RC0H, . . . RC(n−1)H with a redundancy column, and then again determine an ADC value to perform a test. At this time, when a fault occurs in the ADC value again, a sub-array itself including the weight array 100 and the reference array 200 may be replaced with a redundancy sub-array.

Figure 14:
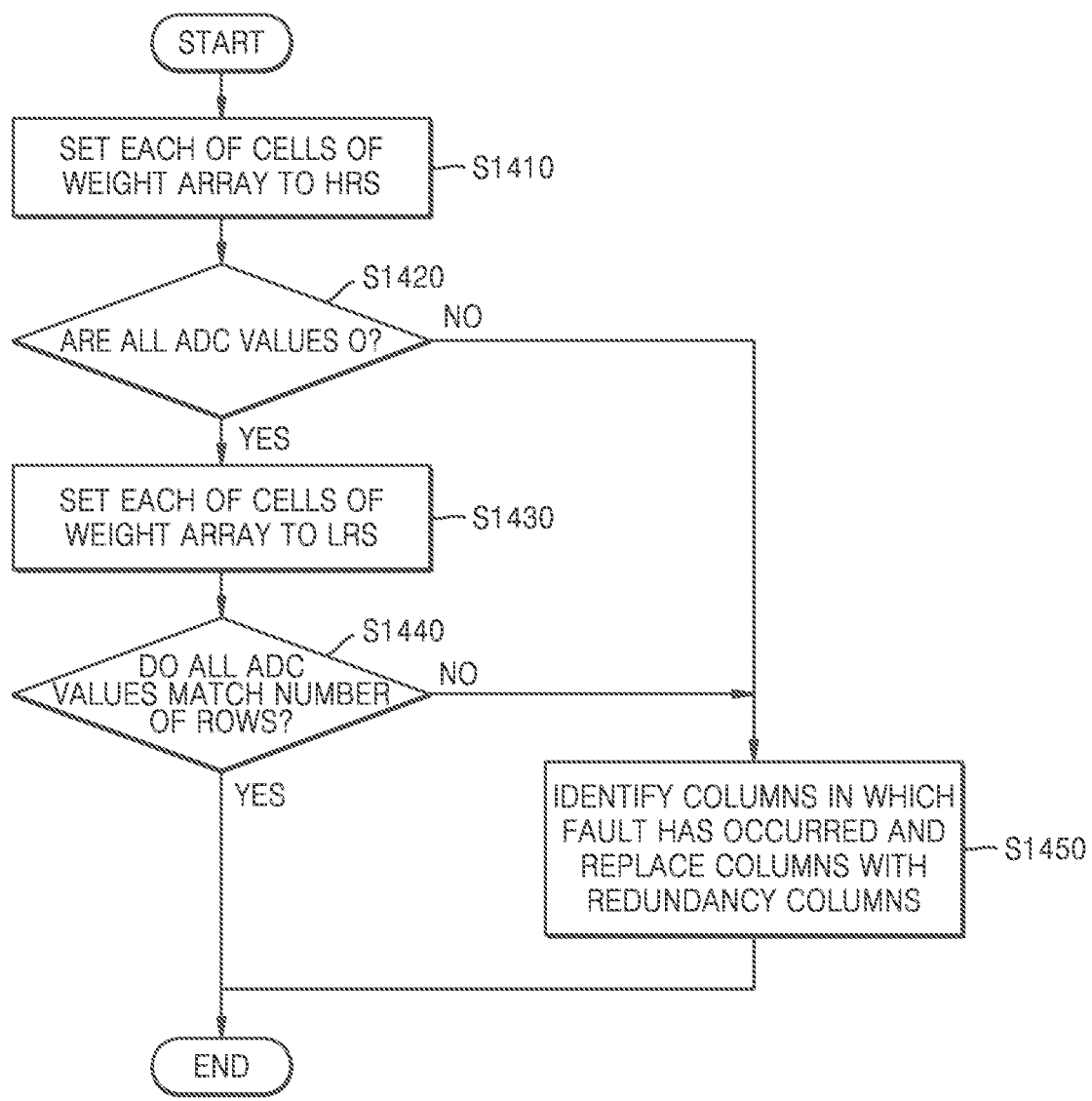
FIG. 14 is a flowchart illustrating a column repair method of a sub-array that does not include a reference array according to some embodiments.

FIG. 14 is a flowchart illustrating a column repair method of a sub-array 10 that does not include the reference array 200 according to some embodiments.

Referring to FIG. 14, the sub-array 10 may include only the weight array 100. In operation S1410, the neuromorphic computing device 20 may set each of cells of the weight array 100 to the high resist state HRS. Because all cells of the weight array 100 are in the high resist state HRS, the read currents Iread_1 to Iread_N output respectively from a plurality of columns may be lower than the first reference current Iref_1. Accordingly, output values of all ADCs corresponding to the plurality of columns may be 0.

In operation S1420, the neuromorphic computing device 20 may determine whether all ADC values are 0. When all ADC values are not 0, the weight array 100 may include at least one column in which a fault has occurred. For example, one column of the plurality of columns of the weight array 100 may include a resistive memory cell in which a bit flip occurs or which is stuck to the low resist state LRS. Alternatively, a column fault may occur in another one of the plurality of columns of the weight array 100. When all ADC values are not 0, the neuromorphic computing device 20 may perform operation S1450. In operation S1450, when all ADC values are not 0, the neuromorphic computing device 20 may identify that the column fault has occurred in a column of an ADC that does not output 0, and may be replaced with a redundancy column of the weight array 100.

In operation S1430, the neuromorphic computing device 20 may set each of cells of the weight array 100 to the low resist state LRS. Because all cells of the weight array 100 are in the low resist state LRS, the read currents Iread_1 to Iread_N output respectively from the plurality of columns may be higher than the third reference current Iref_3. Accordingly, the output values of all ADCs corresponding to the plurality of columns may be (number of rows−1).

In operation S1440, the neuromorphic computing device 20 may determine whether all ADC values match the (number of rows−1). For example, a cell stuck to the high resist state HRS may be included in the cells of the weight array 100. A cell fault based on the cell stuck to the high resist state HRS may not be detected in operations S1410 and S1420. The neuromorphic computing device 20 may set all cells of the weight array 100 to the high resist state HRS, and then set the cells again to the low resist state LRS and detect the cell fault stuck to a specific resist state (HRS or LRS). Similarly, in case of a column fault in which any bit line is grounded or any source line is grounded, the column fault may not be detected in operation S1420. The neuromorphic computing device 20 may set all cells of the weight array 100 to the low resist state LRS, and determine whether all ADC values match the (number of rows−1), thereby identifying the column fault due to the ground. In operation S1450, when all ADC values do not match the (number of rows−1), the neuromorphic computing device 20 may identify that the column fault has occurred in the column of the ADC that does not output the (number of rows−1), and replace the column of the ADC with a redundancy column of the weight array 100.

Figure 15A:
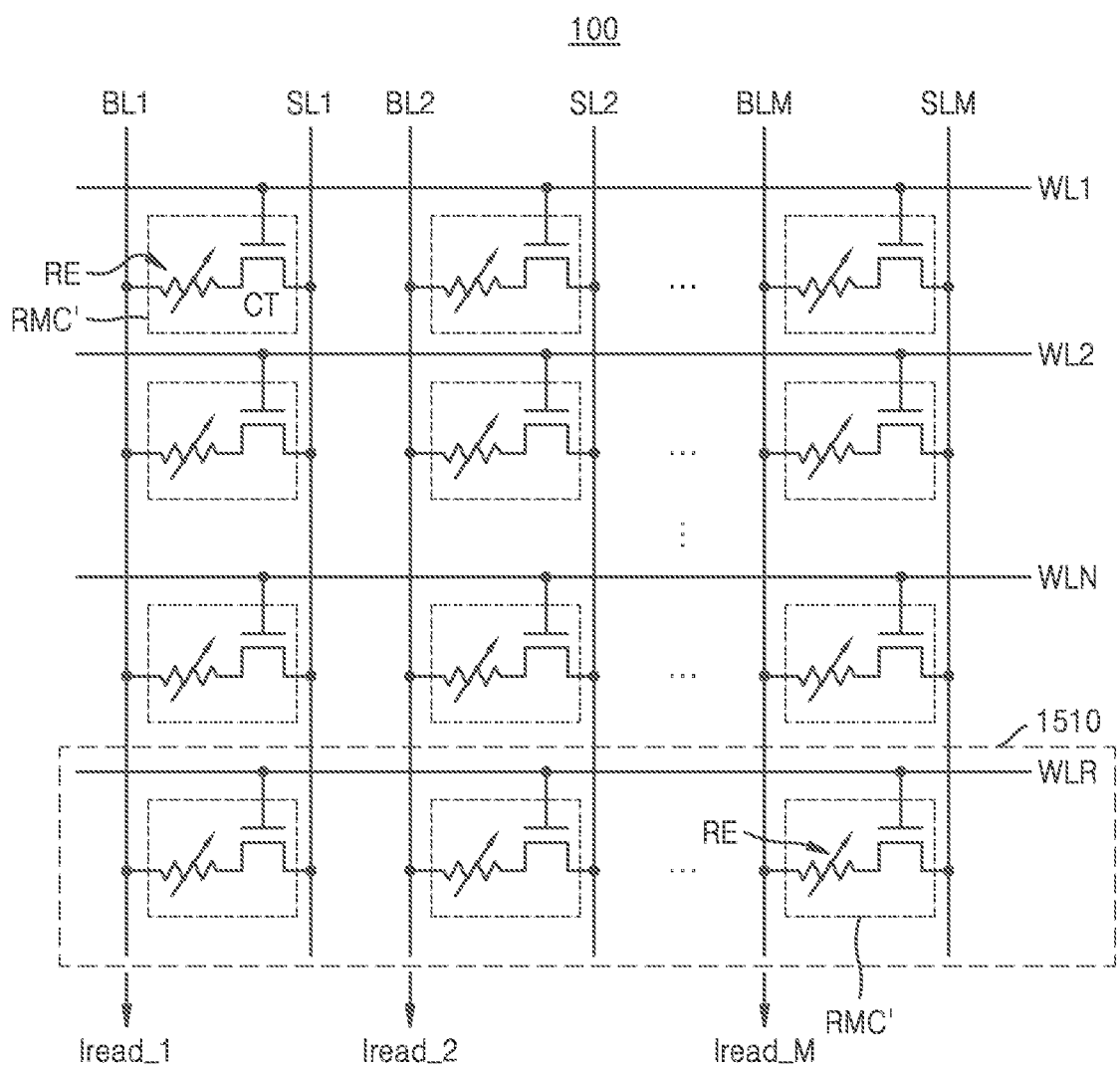
FIG. 15A is a diagram illustrating an example of a weight array including a redundancy row according to an embodiment.

FIG. 15A is a diagram illustrating an example of the weight array 100 included in the neuromorphic computing device 20 according to an embodiment.

Referring to FIG. 15A, the weight array 100 may further include at least one redundancy row. For example, the weight array 100 may further include one redundancy row 1510. The weight array 100 may further include a plurality of resistive memory cells in regions where the redundancy word line WLR corresponding to the redundancy row 1510 intersect with the plurality of bit lines BL1 to BLM, and the plurality of source lines SL1 to SLM. Hereinafter, redundant descriptions with those of FIG. 3C are omitted.

Each of the plurality of resistive memory cells RMC' corresponding to the redundancy row 1510 may include the cell transistor CT and the resistive element RE, and may be connected to the redundancy word line WLR, the plurality of bit lines BL1 to BLM, and the plurality of source lines SL1 to SLM. For example, the cell transistor CT may include a first electrode connected to the plurality of source lines SL1 to SLM, a gate electrode connected to the redundancy word line WLR, and a second electrode. The resistive element RE may be connected between the second electrode of the cell transistor CT and one of the plurality of bit lines BL1 to BLM.

When a row fault is not detected in the weight array 100 or the reference array 200, the neuromorphic computing device 20 may deactivate the redundancy row 1510. That is, the neuromorphic computing device 20 may turn off the redundancy word line WLR to deactivate the redundancy row 1510. The neuromorphic computing device 20 may reduce power consumption by deactivating the redundancy word line WLR, and may remove disturbance with other word lines. Additionally, the neuromorphic computing device 20 may set cells of the redundancy row 1510 to the high resist state HRS in order to reduce leakage current generated as much as possible even when the redundancy word line WLR is turned off.

Figure 15B:
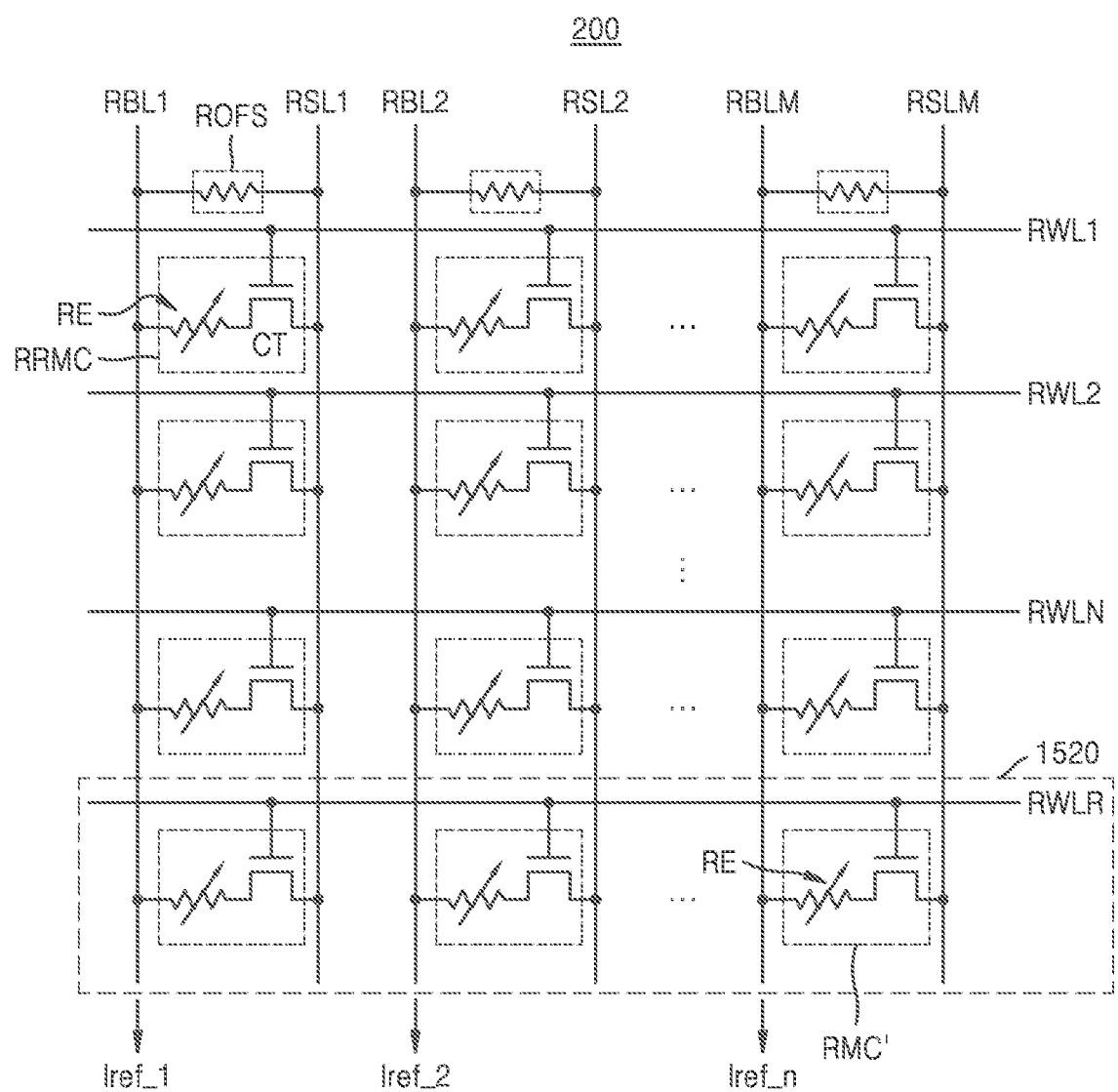
FIG. 15B is a diagram illustrating an example of a reference array including a redundancy reference row according to an embodiment.

FIG. 15B is a diagram illustrating an example of the reference array 200 included in the neuromorphic computing device 20 according to an embodiment.

Referring to FIG. 15B, the reference array 200 may further include at least one redundancy row. For example, the reference array 200 may further include the one redundancy reference row 1520. The reference array 200 may further include a plurality of resistive memory cells in regions where the redundancy reference word line RWLR corresponding to the redundancy reference row 1520 intersect the plurality of reference bit lines RBL1 to RBLM and the plurality of source lines RSL1 to RSLM. Hereinafter, redundant descriptions with those of FIG. 3C are omitted.

Each of the plurality of resistive memory cells RMC' corresponding to the redundancy reference row 1520 may include the cell transistor CT and the resistive element RE, and may be connected to the redundancy reference word line RWLR, the plurality of reference bit lines RBL1 to RBLM, and the plurality of reference source lines RSL1 to RSLM. For example, the cell transistor CT may include a first electrode connected to the plurality of reference source lines RSL1 to RSLM, a gate electrode connected to the redundancy reference word line RWLR, and a second electrode. The resistive element RE may be connected between the second electrode of the cell transistor CT and one of the plurality of reference bit lines RBL1 to RBLM.

When a row fault is not detected in the weight array 100 or the reference array 200, the neuromorphic computing device 20 may deactivate redundancy reference row 1520. That is, the neuromorphic computing device 20 may turn off the redundancy reference word line RWLR to deactivate the redundancy reference row 1520. The neuromorphic computing device 20 may reduce power consumption by deactivating the redundancy reference word line RWLR, and may reduce disturbance with other word lines. Additionally, the neuromorphic computing device 20 may set cells of the redundancy reference row 1520 to the high resist state HRS in order to reduce leakage current generated as much as possible even when the redundancy reference word line RWLR is turned off.

FIG. 16 is a table illustrating a row fault repair operation of the neuromorphic computing device 20 according to an embodiment.

According to an embodiment, with reference to FIG. 9A, the neuromorphic computing device 20 may identify that a row fault has occurred. However, because the neuromorphic computing device 20 operates in a column unit, it may be impossible to distinguish whether a fault has occurred in a row of the weight array 100 or a fault has occurred in a reference row of the reference array 200. The neuromorphic computing device 20 may repeatedly set the low resist state LRS sequentially for each row to identify the row in which a fault has occurred.

According to an embodiment, the neuromorphic computing device 20 may replace each row of the weight array 100 and the reference array 200 at a position where the fault has occurred. For example, a row of the weight array 100 at the position where the fault has occurred may be replaced with the redundancy row 1510. A row of the reference array 200 at the position where the fault has occurred may be replaced with the redundancy reference row 1520.

According to an embodiment, the neuromorphic computing device 20 may perform an additional operation on the row at the position where the fault has occurred. Because the neuromorphic computing device 20 operates in a column unit, the row in which the fault has occurred still may exist in the weight array 100 and the reference array 200 and may cause an error in an ADC value.

Each row of weight array 100 and reference row of reference array 200 may correspond to one of three states. For example, the row of the weight array 100 and the reference row of the reference array 200 may be rows in which no fault has occurred, may output a low current, or may output a high current.

According to an embodiment, an imbalance may occur between output currents of the weight array 100 and the reference array 200 in the row at the position where the fault has occurred. For example, when no fault has occurred in the row of the weight array 100, a current of normal magnitude may be output, and when a fault has occurred in the row of the reference array 200, a low current may be output. Alternatively, when no fault has occurred in the reference row of the reference array 200, a current of normal magnitude may be output, and when a fault has occurred in the row of the weight array 100, a low current may be output. Because the neuromorphic computing device 20 operates in a column unit, it is necessary to resolve the imbalance. The neuromorphic computing device 20 may turn off a word line of an array that outputs a current of normal magnitude, and set all cells to the high resist state HRS in order to minimize the magnitude of leakage current. For example, when the row of the weight array 100 outputs the current of normal magnitude, the neuromorphic computing device 20 may set all cells included in a row of the weight array 100 at a position where the fault has occurred to the high resist state HRS, and turn off a word line corresponding to the row. For another example, when the reference row of the reference array 200 outputs the current of normal magnitude, the neuromorphic computing device 20 may set all cells included in the reference row of the reference array 200 at a position where the fault has occurred to the high resist state HRS, and turn off a word line corresponding to the reference row.

According to an embodiment, an imbalance may occur between output currents of the weight array 100 and the reference array 200 in a row at a position where a fault has occurred. For example, when no fault has occurred in the row of the weight array 100, a current of normal magnitude may be output, and when a fault has occurred in the reference row of the reference array 200, a high current may be output. Alternatively, when no fault has occurred in the reference row of the reference array 200, a current of normal magnitude may be output, and when a fault has occurred in the row of the weight array 100, a high current may be output. In order to resolve the imbalance, the neuromorphic computing device 20 may turn on a word line of an array that outputs the current of normal magnitude, and set all the cells to the low resist state LRS in order to set the maximum magnitude of the output current. For example, when the row of the weight array 100 outputs the current of normal magnitude, the neuromorphic computing device 20 may set all cells included in a row of the weight array 100 at a position where the fault has occurred to the low resist state LRS, and turn on the word line. For another example, when the reference row of the reference array 200 outputs the current of normal magnitude, the neuromorphic computing device 20 may set all cells included in the reference row of the reference array 200 at a position where the fault has occurred to the low resist state LRS, and turn-on the word line corresponding to the reference row. That is, the neuromorphic computing device 20 may match the output current of the weight array 100 based on the row in which the fault has occurred and the output current of the reference array 200 to minimize the effect of a row fault.

According to an embodiment, a fault may occur in both the row of the weight array 100 and the reference row of the reference array 200. For example, the row of the weight array 100 may output a low current, and the reference row of the reference array 200 may also output a low current. In this case, because there is no imbalance between the output currents of the weight array 100 and the reference array 200, the neuromorphic computing device 20 may not need an additional operation after respectively replacing the row of the weight array 100 outputting the low current and the reference row of the reference array 200 outputting the low current with the redundancy row 1510 and the redundancy reference row 1520 (use the resulting value as is). According to an embodiment, a fault may occur in both the row of the weight array 100 and the reference row of the reference array 200. For example, the row of the weight array 100 may output a high current, and the reference row of the reference array 200 may also output a high current. In this case, because there is no imbalance between the output currents of the weight array 100 and the reference array 200, the neuromorphic computing device 20 may not need an additional operation after respectively replacing the row of the weight array 100 outputting the high current and the reference row of the reference array 200 outputting the high current with the redundancy row 1510 and the redundancy reference row 1520 (use the resulting value as is).

Figure 17:
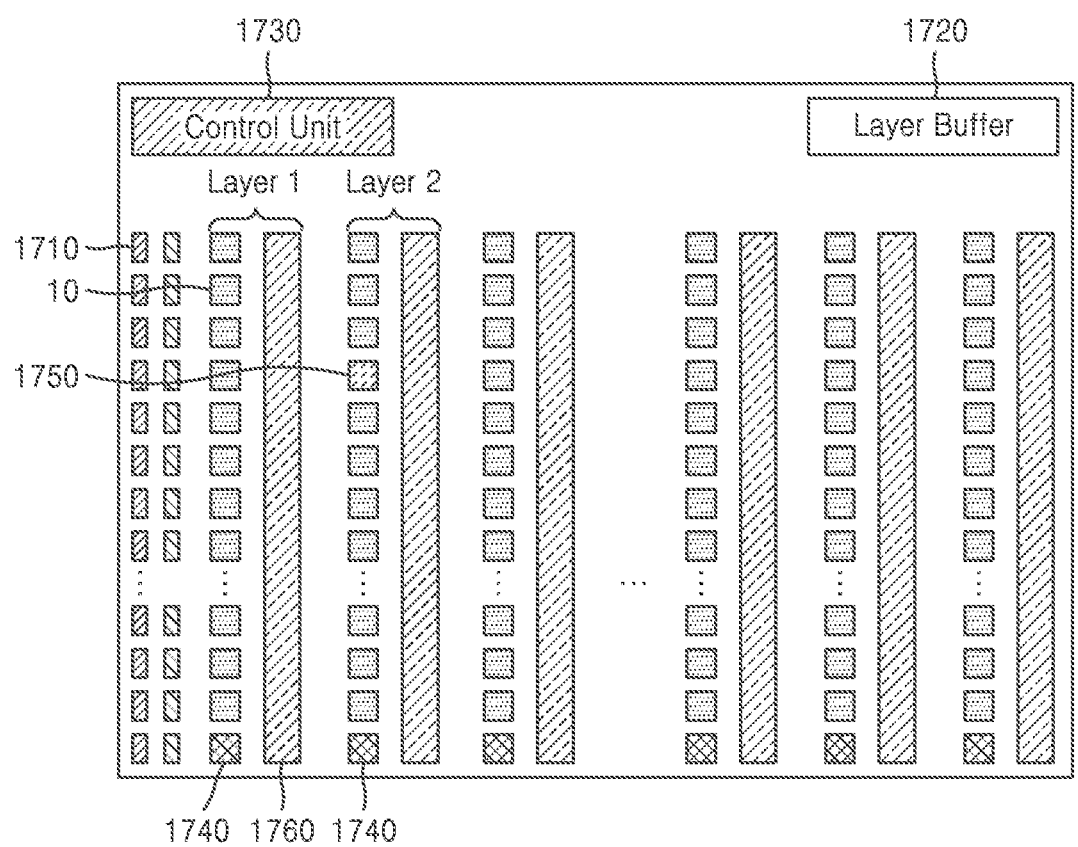
FIG. 17 illustrates another example of a neuromorphic computing device according to some embodiments.

FIG. 17 illustrates another example of a neuromorphic computing device 20 according to some embodiments.

Referring to FIG. 17, the neuromorphic computing device 20 may include an input buffer 1710, a layer buffer 1720, a control unit 1730, a redundancy sub-array 1740, a summation tree 1760, and a plurality of sub-arrays. Because currents generated in a plurality of rows are summed in the sub-array 10, the magnitude of the output currents is large, and thus, the size of the sub-array 10 may not be large, and accordingly, the neuromorphic computing device 20 may include the plurality of sub-arrays.

The input buffer 1710 may store values input to neural network model. The values may be input vectors. The input vector input to the input buffer 1710 may be transferred to the corresponding sub-array 10 so that an analog MAC operation may be performed. The summation tree 1760 may calculate a partial sum to output a final ADC value. The final ADC value may be transferred back to the input buffer 1710 and then transferred to sub-arrays of a next layer Layer 2. According to various embodiments, the input buffer 1710 may be implemented as an SRAM.

The control unit 1730 may be a processor (e.g., one or more programmed microprocessors and associated circuitry). The control unit 1730 may control the input buffer 1710 so that the final ADC value is not changed due to the redundancy sub-array 1740 of a first layer Layer 1. That is, 0 may be input to the input buffer 1710 corresponding to the redundancy sub-array 1740. Also, the control unit 1730 may perform power gating on the redundancy sub-array 1740 to reduce power consumption.

According to an embodiment, a fault may occur in a sub-array 1750 of the second layer Layer 2. The layer buffer 1720 may store fault information indicating in which sub-array of which layer a fault has occurred. The layer buffer 1720 may be implemented as a non-volatile memory. The control unit 1730 may input 0 to the input buffer 1710 corresponding to the sub-array 1750 in which the fault has occurred, and may input a value to be input to the sub-array 1750 to the input buffer 1710 corresponding to a redundancy sub-array 1740. Also, the control unit 1730 may perform power gating on the sub-array 1750 in which the fault has occurred.

In the above-described embodiment, the layer buffer 1720 is implemented inside the neuromorphic computing device 20 to store fault information, but is not limited thereto. According to various embodiments, the neuromorphic computing device 20 may generate metadata including the fault information, and when driven, load the metadata to obtain information about sub-arrays in which the fault has occurred.

Figure 18:
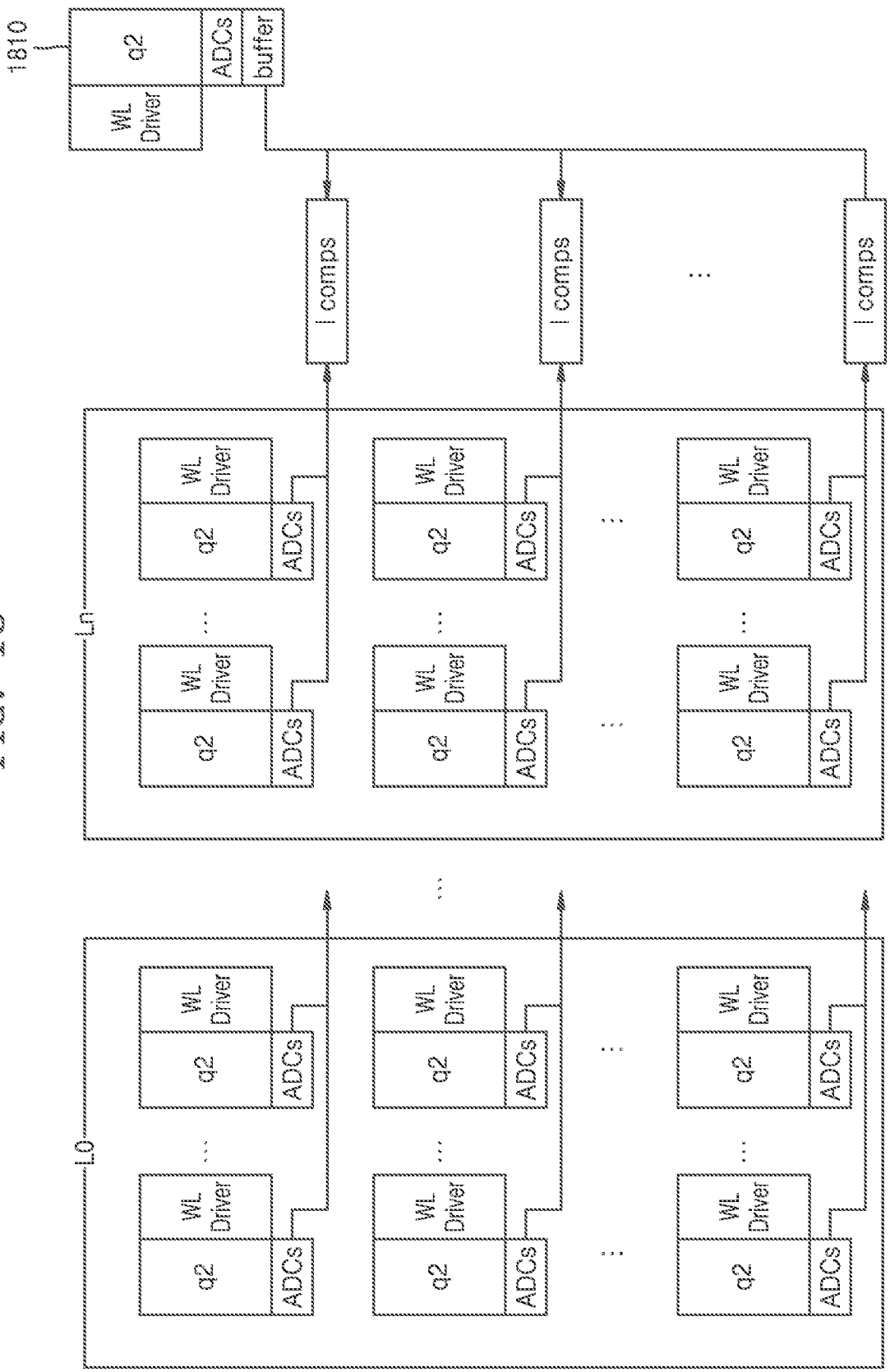
FIG. 18 illustrates another example of a neuromorphic computing device according to some embodiments.

FIG. 18 illustrates another example of the neuromorphic computing device 20 according to some embodiments.

Referring to FIG. 18, the neuromorphic computing device 20 may further include a plurality of weight arrays and a reference array 1810. That is, because values of a reference cell memory array are the same for each sub-array, each of sub-arrays may include only a weight cell memory array, and the reference array 1810 including only the reference cell memory array may be disposed.

The neuromorphic computing device 20 may select one arbitrary sub-array from a first layer L0 and perform the fault detection method illustrated in FIG. 8A with respect to the reference array 1810. According to an embodiment, when a result as in the table of FIG. 9E is obtained, the neuromorphic computing device 20 may identify that a fault has occurred in the reference array 1810 and repair the fault. In this case, because a fault has not occurred in the reference array 1810 or is repaired even if the fault has occurred, the neuromorphic computing device 20 may be sufficient to identify whether a fault has occurred in the remaining plurality of sub-arrays according to the fault detection method of FIG. 14.

While example embodiments have been particularly shown and described, it will be understood that various changes in form and details may be made therein without departing from the spirit and scope of the following claims.

What is claimed is:

1. A neuromorphic device comprising:
 a first memory cell array comprising:
  first resistive memory cells connected to word lines, bit lines, and source lines,
  second resistive memory cells connected to the word lines, at least one redundancy bit line, and at least one redundancy source line, and
  third resistive memory cells connected to at least one redundancy word line, the bit lines, and the source lines,
  wherein the first memory cell array is configured to store weight data corresponding to a weight of a neural network in the first resistive memory cells, and generate a plurality of read currents based on input signals and the weight data;
a second memory cell array comprising:
first reference resistive memory cells connected to reference word lines, reference bit lines, and reference source lines,
second reference resistive memory cells connected to the reference word lines, at least one redundancy reference bit line, and at least one redundancy reference source line,
third reference resistive memory cells connected to at least one redundancy reference word line, the reference bit lines, and the reference source lines,
wherein the second memory cell array is configured to generate a plurality of reference currents; and
an analog to digital converter (ADC) circuit configured to convert the plurality of read currents into a plurality of digital signals based on the plurality of reference currents.

2. The neuromorphic device of claim 1, wherein the second resistive memory cells are configured to replace first cells of a column of the first memory cell array in which a first fault has occurred, and
wherein the third resistive memory cells are configured to replace second cells of a row of the first memory cell array in which a second fault has occurred.

3. The neuromorphic device of claim 2, wherein the second resistive memory cells are configured to preferentially replace the first resistive memory cells of a first column corresponding to a most significant bit (MSB) when a first number of the at least one redundancy bit line is less than a second number of columns of the first memory cell array in which the first fault has occurred.

4. The neuromorphic device of claim 1, wherein the second reference resistive memory cells are configured to replace first cells of a column of the second memory cell array in which a first fault has occurred, and
wherein the third reference resistive memory cells are configured to replace second cells of a row of the second memory cell array in which a second fault has occurred.

5. The neuromorphic device of claim 1, wherein the neuromorphic device is configured to:
set M−1 cells of an M-th column with respect to a left of the first reference resistive memory cells to a low resist state,
set the first resistive memory cells to a high resist state, and
compare whether all outputs of the ADC circuit corresponding to each of the bit lines match 0.

6. The neuromorphic device of claim 5, wherein the neuromorphic device is further configured to:
set a count value to measure a number of repetitions to 1,
set cells included in a row in an order corresponding to the count value among the first resistive memory cells to the low resist state, and
compare whether the outputs of the ADC circuit corresponding to each of the bit lines match the count value.

7. The neuromorphic device of claim 6, wherein the neuromorphic device is further configured to:
compare whether the count value matches a number of rows minus one of the first resistive memory cells,
based on the count value not matching the number of rows minus one of the first resistive memory cells, repeatedly perform incrementing the count value by one, an operation of setting the cells included in the row in the order corresponding to the count value among the first resistive memory cells to the low resist state, and comparing whether the outputs of the ADC circuit corresponding to each of the bit lines match the count value.

8. The neuromorphic device of claim 7, wherein the neuromorphic device is further configured to:
identify a column fault has occurred in a first column of the first memory cell array based on comparison results of an output value of the ADC circuit in the first column not matching with respect to all count values,
identify the column fault has occurred in the second memory cell array based on comparison results of outputs of ADC circuits corresponding to each of the bit lines not matching with respect to a same count value, and
identify a row fault has occurred in at least one of the first memory cell array and the second memory cell array based on comparison results of the outputs of the ADC circuits corresponding to each of the bit lines not matching with respect to all count values.

9. The neuromorphic device of claim 8, wherein the neuromorphic device is further configured to, based on the row fault not being identified, turn off the at least one redundancy word line and the at least one redundancy reference word line.

10. The neuromorphic device of claim 8, wherein the neuromorphic device is further configured to, based on the row fault not being identified, set each of the third resistive memory cells and the third reference resistive memory cells to the high resist state.

11. A neuromorphic device comprising:
an input buffer configured to store input values of a neural network model;
a plurality of sub-arrays configured to perform a multiply and accumulate (MAC) operation based on weights of the neural network model;
a plurality of redundancy sub-arrays;
a layer buffer storing information about at least one sub-array of the plurality of sub-arrays in which a fault has occurred; and
a control unit configured to control the at least one sub-array in which the fault has occurred to be replaced with a first redundancy sub-array of the plurality of redundancy sub-arrays,
wherein each of the plurality of sub-arrays comprises:
a first memory cell array comprising:
first resistive memory cells connected to word lines, bit lines, and source lines,
second resistive memory cells connected to the word lines, at least one redundancy bit line, and at least one redundancy source line, and
third resistive memory cells connected to at least one redundancy word line, the bit lines, and the source lines,
wherein the first memory cell array is configured to store weight data corresponding to a weight of a neural network in the first resistive memory cells, and generate a plurality of read currents based on input signals and the weight data;
a second memory cell array comprising:
first reference resistive memory cells connected to reference word lines, reference bit lines, and reference source lines,
second reference resistive memory cells connected to the reference word lines, at least one redundancy reference bit line, and at least one redundancy reference source line, and third reference resistive memory cells connected to at least one redundancy reference word line, the reference bit lines, and the reference source lines, wherein the second memory cell array is configured to generate a plurality of reference currents; and an analog to digital converter (ADC) circuit configured to convert the plurality of read currents into a plurality of digital signals based on the plurality of reference currents.

12. The neuromorphic device of claim 11, wherein the second resistive memory cells are configured to replace first cells of a column of the first memory cell array in which a first fault has occurred, and wherein the third resistive memory cells are configured to replace second cells of a row of the first memory cell array in which a second fault has occurred.

13. The neuromorphic device of claim 12, wherein the second resistive memory cells are configured to preferentially replace the first resistive memory cells of a first column corresponding to a most significant bit (MSB) when a first number of the at least one redundancy bit line is less than a second number of columns of the first memory cell array in which the fault has occurred.

14. The neuromorphic device of claim 11, wherein the second reference resistive memory cells are configured to replace first cells of a column of the second memory cell array in which a first fault has occurred, and wherein the third reference resistive memory cells are configured to replace second cells of a row of the second memory cell array in which a second fault has occurred.

15. The neuromorphic device of claim 11, wherein the plurality of sub-arrays are configured to calculate based on first weights of a first layer of the neural network model.

16. The neuromorphic device of claim 11, wherein the control unit is further configured to control power gating to be performed on the plurality of redundancy sub-arrays based on the fault not occurring in the plurality of sub-arrays.

17. A neuromorphic device comprising:
a memory cell array comprising:
first resistive memory cells connected to word lines, bit lines, and source lines,
second resistive memory cells connected to the word lines, at least one redundancy bit line, and at least one redundancy source line, and
third resistive memory cells connected to at least one redundancy word line, the bit lines and the source lines,
wherein the memory cell array is configured to store weight data corresponding to a weight of a neural network in the first resistive memory cells, and generate a plurality of read currents based on input signals and the weight data; and
an analog to digital converter (ADC) circuit configured to convert the plurality of read currents into a plurality of digital signals.

18. The neuromorphic device of claim 17, wherein the neuromorphic device is configured to:
set the first resistive memory cells to a high resist state, and
compare whether all outputs of the ADC circuit corresponding to each of the bit lines match zero.

19. The neuromorphic device of claim 18, wherein the neuromorphic device is further configured to:
set the first resistive memory cells to the high resist state, and
compare whether all outputs of the ADC circuit corresponding to each of the bit lines match a number of rows minus one.

20. The neuromorphic device of claim 19, wherein the neuromorphic device is further configured to identify that a column fault has occurred in the first resistive memory cells, based on identifying that all the outputs of the ADC circuit corresponding to each of the bit lines do not match 0, or that all the outputs of the ADC circuit corresponding to each of the bit lines do not match the number of rows minus one.

\* \* \* \* \*